US012690496B2

(12) United States Patent     (10) Patent No.:   US 12,690,496 B2
Noguchi et al.     (45) Date of Patent:     Jul. 21, 2026

(54) THREE DIMENSIONAL HETEROGENEOUS INTEGRATION WITH DOUBLE-SIDED SEMICONDUCTOR DIES AND METHODS OF FORMING THE SAME

(71) Applicant: Taiwan Semiconductor Manufacturing Company Limited, Hsinchu (TW)

(72) Inventors: Hiroki Noguchi, Hsinchu City (TW); Yih Wang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 485 days.

(21) Appl. No.: 18/310,555

(22) Filed: May 2, 2023

(65) Prior Publication Data

US 2024/0113078 A1     Apr. 4, 2024

Related U.S. Application Data

(60) Provisional application No. 63/412,832, filed on Oct. 3, 2022.

(51) Int. Cl.
    *H10W 90/00*     (2026.01)
    *H10B 80/00*     (2026.01)
    (Continued)

(52) U.S. Cl.
    CPC ............ *H10W 90/00* (2026.01); *H10B 80/00* (2023.02); *H10W 20/42* (2026.01);
    (Continued)

(58) Field of Classification Search
    CPC . H01L 2224/08145; H01L 2224/80895; H01L 2224/80896; H01L 2225/06524;
    (Continued)

(56) References Cited

U.S. PATENT DOCUMENTS 11,342,214 B1 *   5/2022   Or-Bach ............ H10D 30/0411
12,381,193 B2 *   8/2025   Gomes .................... H01L 24/08
(Continued)

FOREIGN PATENT DOCUMENTS

TW     202006890 A    2/2020
TW     202224141 A    6/2022
WO   WO-2018039645 A1 *   3/2018    ......... H10D 30/6211

OTHER PUBLICATIONS

Jianq Chyun Intellectual Property Office; TW Application No. 112123888; Office Action dated Aug. 26, 2024; 12 pages.

*Primary Examiner* — Telly D Green
(74) *Attorney, Agent, or Firm* — The Marbury Law Group, PLLC

(57)       ABSTRACT

An embodiment semiconductor device may include a semiconductor die stack having a first semiconductor die including a first front-side interconnect structure and a first back-side interconnect structure, and a second semiconductor die including a second front-side interconnect structure and a second back-side interconnect structure, such that the first back-side interconnect structure is electrically connected to the second front-side interconnect structure. The first semiconductor die may include a first central portion disposed between the first front-side interconnect structure and the first back-side interconnect structure, the second semiconductor die may include a second central portion disposed between the second front-side interconnect structure and the second back-side interconnect structure, and each of the first central portion and second central portion may include electrical circuit elements formed in or on a semiconductor substrate. Each of the first and second front-side interconnect structures and back-side interconnect structures may include interconnects formed within a dielectric layer.

20 Claims, 15 Drawing Sheets

(51) Int. Cl.
    *H10W 20/42*     (2026.01)
    *H10W 80/00*     (2026.01)

(52) U.S. Cl.
    CPC ........ *H10W 80/312* (2026.01); *H10W 80/327* (2026.01); *H10W 90/792* (2026.01)

(58) Field of Classification Search
    CPC ....... H01L 2225/06541; H01L 23/5226; H01L 24/08; H01L 24/80; H01L 25/0652; H01L 25/0657; H01L 25/18; H01L 25/50; H10B 80/00
    See application file for complete search history.

(56)            References Cited

U.S. PATENT DOCUMENTS

| | | | | |
|---|---|---|---|---|
| 2007/0273016 | A1* | 11/2007 | Bol | H01L 25/074 257/E23.071 |
| 2009/0152632 | A1* | 6/2009 | Chapman | H10D 89/601 438/237 |
| 2010/0289064 | A1* | 11/2010 | Or-Bach | H10B 12/053 257/209 |
| 2010/0291749 | A1* | 11/2010 | Or-Bach | H10D 88/01 257/E21.598 |
| 2011/0049577 | A1* | 3/2011 | Or-Bach | H10B 12/053 257/209 |
| 2011/0092030 | A1* | 4/2011 | Or-Bach | H10B 10/00 438/129 |
| 2011/0108888 | A1* | 5/2011 | Or-Bach | H10D 86/01 257/E27.105 |
| 2011/0121366 | A1* | 5/2011 | Or-Bach | H10B 10/00 257/E27.108 |
| 2014/0220760 | A1* | 8/2014 | Bachman | H01L 23/481 438/424 |
| 2018/0301380 | A1* | 10/2018 | Or-Bach | H10B 43/20 |
| 2018/0350685 | A1* | 12/2018 | Or-Bach | H03K 19/0948 |
| 2018/0350689 | A1* | 12/2018 | Or-Bach | H03K 17/687 |
| 2019/0006240 | A1* | 1/2019 | Or-Bach | H10B 10/00 |
| 2019/0027409 | A1* | 1/2019 | Or-Bach | H03K 19/17764 |
| 2019/0057903 | A1* | 2/2019 | Or-Bach | H01L 21/76254 |
| 2019/0067109 | A1* | 2/2019 | Or-Bach | H03K 19/17704 |
| 2019/0067110 | A1* | 2/2019 | Or-Bach | G11C 5/063 |
| 2019/0074222 | A1* | 3/2019 | Or-Bach | H03K 19/0948 |
| 2019/0109049 | A1* | 4/2019 | Or-Bach | H03K 17/687 |
| 2019/0139827 | A1* | 5/2019 | Or-Bach | H10D 86/011 |
| 2019/0148234 | A1* | 5/2019 | Or-Bach | H10B 43/40 438/455 |
| 2020/0013754 | A1* | 1/2020 | Gao | H01L 23/5384 |
| 2020/0343218 | A1* | 10/2020 | Hu | H01L 24/80 |
| 2021/0125852 | A1* | 4/2021 | Or-Bach | G11C 29/1201 |
| 2021/0134642 | A1* | 5/2021 | Or-Bach | H10B 12/053 |
| 2021/0134643 | A1* | 5/2021 | Or-Bach | H01L 21/76898 |
| 2021/0134644 | A1* | 5/2021 | Or-Bach | H10D 30/69 |
| 2021/0134645 | A1* | 5/2021 | Or-Bach | H10B 43/20 |
| 2021/0134646 | A1* | 5/2021 | Or-Bach | H10D 30/711 |
| 2021/0159108 | A1* | 5/2021 | Or-Bach | H01L 21/76254 |
| 2021/0159109 | A1* | 5/2021 | Or-Bach | H10D 30/0411 |
| 2021/0159110 | A1* | 5/2021 | Or-Bach | H10D 30/792 |
| 2021/0193498 | A1* | 6/2021 | Or-Bach | H10D 30/60 |
| 2021/0217643 | A1* | 7/2021 | Or-Bach | H10D 30/0411 |
| 2021/0242067 | A1* | 8/2021 | Or-Bach | H10B 41/40 |
| 2021/0242068 | A1* | 8/2021 | Or-Bach | H10D 30/6757 |
| 2021/0249296 | A1* | 8/2021 | Or-Bach | H10B 43/20 |
| 2021/0257244 | A1* | 8/2021 | Or-Bach | H10B 63/30 |
| 2021/0272835 | A1* | 9/2021 | Or-Bach | H10B 12/09 |
| 2021/0305079 | A1* | 9/2021 | Or-Bach | H10D 30/0411 |
| 2021/0320026 | A1* | 10/2021 | Or-Bach | H10D 30/792 |
| 2021/0407842 | A1* | 12/2021 | Or-Bach | H10B 43/40 |
| 2022/0013502 | A1* | 1/2022 | Lee | H01L 25/0652 |
| 2022/0037273 | A1* | 2/2022 | Park | H01L 25/0657 |
| 2022/0084869 | A1* | 3/2022 | Or-Bach | H10B 20/25 |
| 2022/0093440 | A1* | 3/2022 | Or-Bach | G11C 29/006 |
| 2022/0093441 | A1* | 3/2022 | Or-Bach | H10B 63/845 |
| 2022/0122877 | A1* | 4/2022 | Or-Bach | H10B 20/25 |
| 2022/0165602 | A1* | 5/2022 | Or-Bach | H01L 21/76254 |
| 2022/0165722 | A1* | 5/2022 | Park | H01L 25/18 |
| 2022/0173090 | A1* | 6/2022 | Gomes | H01L 23/5384 |
| 2022/0181186 | A1* | 6/2022 | Or-Bach | H10D 86/201 |
| 2022/0181187 | A1* | 6/2022 | Or-Bach | H10D 30/69 |
| 2022/0208594 | A1* | 6/2022 | Or-Bach | H10B 10/125 |
| 2022/0208723 | A1* | 6/2022 | Katkar | H01L 24/83 |
| 2022/0223458 | A1* | 7/2022 | Or-Bach | H10D 64/027 |
| 2022/0223459 | A1* | 7/2022 | Or-Bach | H10D 30/0411 |
| 2022/0238367 | A1* | 7/2022 | Or-Bach | H10B 10/00 |
| 2022/0262666 | A1* | 8/2022 | Or-Bach | H01L 21/76254 |
| 2022/0310470 | A1* | 9/2022 | Chen | H01L 21/6835 |
| 2022/0336252 | A1* | 10/2022 | Or-Bach | H10D 84/907 |
| 2022/0336253 | A1* | 10/2022 | Or-Bach | H10D 86/201 |
| 2022/0375779 | A1* | 11/2022 | Or-Bach | H10D 64/027 |
| 2023/0019049 | A1* | 1/2023 | Or-Bach | G11C 5/025 |
| 2023/0170243 | A1* | 6/2023 | Or-Bach | H10B 43/20 438/129 |
| 2023/0187413 | A1* | 6/2023 | Yoshihara | H10B 51/20 257/777 |
| 2023/0352333 | A1* | 11/2023 | Or-Bach | H10D 30/0413 |
| 2023/0402438 | A1* | 12/2023 | Liu | H01L 23/49833 |
| 2024/0063200 | A1* | 2/2024 | Niu | H01L 24/73 |
| 2024/0090235 | A1* | 3/2024 | Tsai | H10B 63/30 |

* cited by examiner

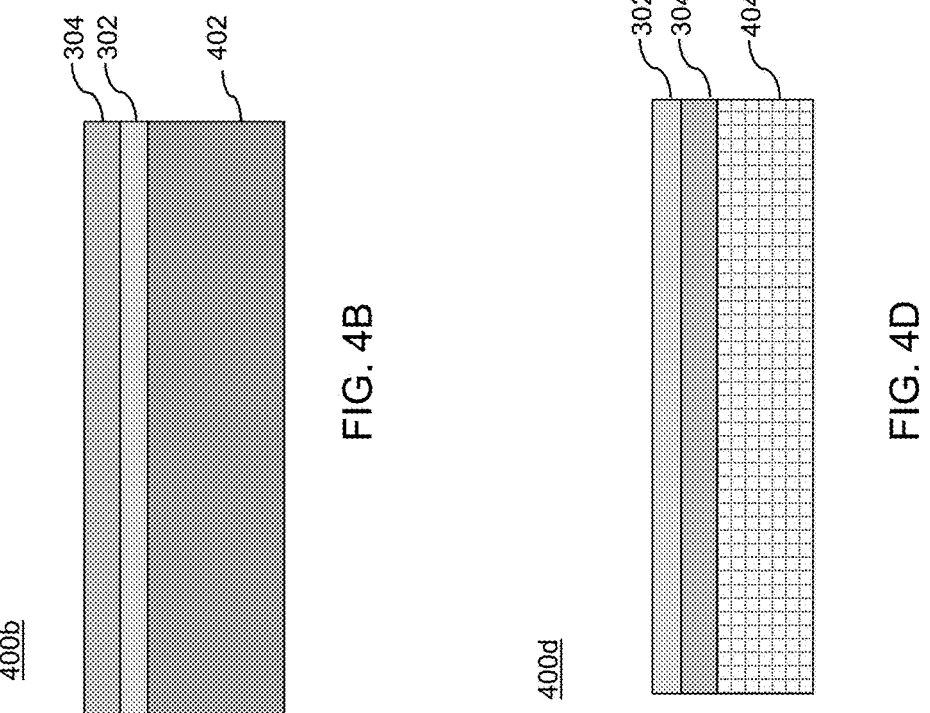
FIG. 4A
FIG. 4B
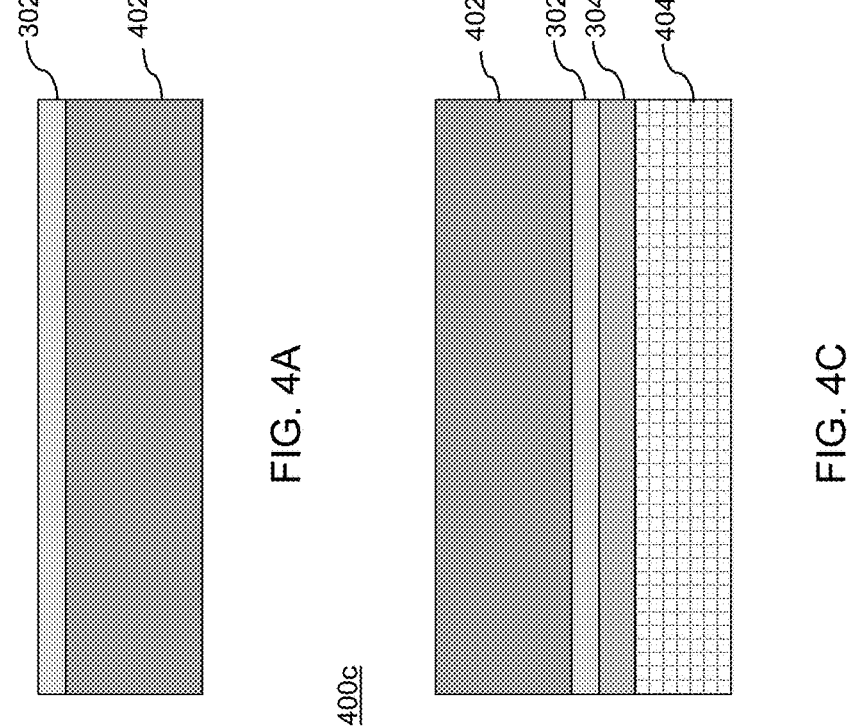
FIG. 4C
FIG. 4D

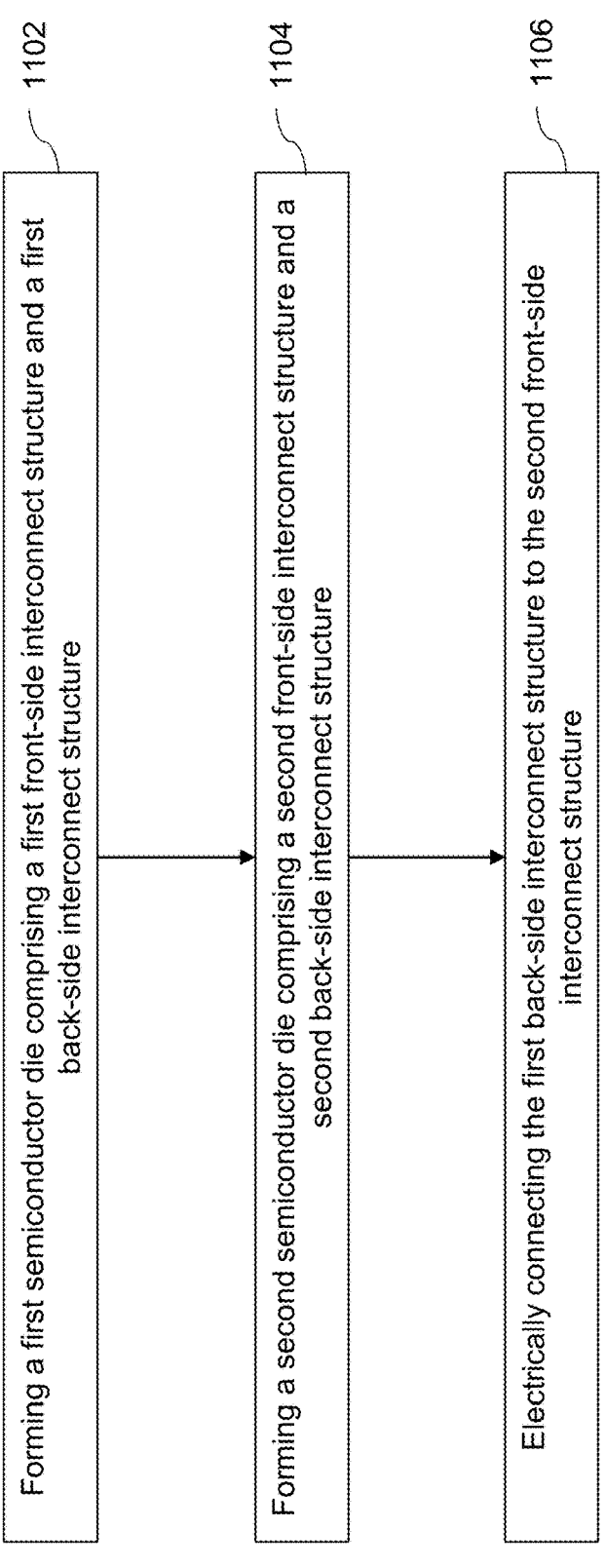

1102

Forming a first semiconductor die comprising a first front-side interconnect structure and a first back-side interconnect structure

1104

Forming a second semiconductor die comprising a second front-side interconnect structure and a second back-side interconnect structure

1106

Electrically connecting the first back-side interconnect structure to the second front-side interconnect structure

THREE DIMENSIONAL HETEROGENEOUS INTEGRATION WITH DOUBLE-SIDED SEMICONDUCTOR DIES AND METHODS OF FORMING THE SAME

RELATED APPLICATIONS

This application claims priority to U.S. Provisional Patent Application No. 63/412,832, entitled "A 3D Heterogenous Integration Method Using Back-Side Back-End Layers" filed on Oct. 3, 2022, the entire contents of which are incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers over a semiconductor substrate, and patterning the various material layers using lithography and etching to form circuit components and elements thereon. Dozens or hundreds of integrated circuits are typically manufactured on a single semiconductor wafer, and individual dies on the wafer are singulated by sawing between the integrated circuits along scribe lines. The individual dies are typically packaged separately, in multi-chip modules, or in other types of packaging, for example.

As semiconductor packages have become more complex, package sizes have tended to become larger to accommodate greater numbers of integrated circuits and/or dies per package. These larger and more complex semiconductor packages have created challenges in making effective and reliable interconnections among various components of the semiconductor package. As such, there is an ongoing need for improvements to semiconductor package designs with an emphasis on reducing interconnect lengths to thereby reduce ohmic loss, heat generation, and signal delay.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a vertical cross-sectional view of an intermediate structure that may be used in the formation of one or more double-sided semiconductor dies, according to various embodiments.

FIG. 4B is a vertical cross-sectional view of a further intermediate structure that may be used in the formation of one or more double-sided semiconductor dies, according to various embodiments.

FIG. 4C is a vertical cross-sectional view of a further intermediate structure that may be used in the formation of one or more double-sided semiconductor dies, according to various embodiments.

FIG. 4D is a vertical cross-sectional view of a further intermediate structure that may be used in the formation of one or more double-sided semiconductor dies, according to various embodiments.

FIG. 9A is a vertical cross-sectional view of a plurality of double-sided semiconductor dies electrically coupled to one another to form a semiconductor die stack, according to various embodiments.

FIG. 9B is a vertical cross-sectional view of a plurality of double-sided semiconductor dies electrically coupled to one another to form a further semiconductor die stack, according to various embodiments.

FIG. 9C is a vertical cross-sectional view of a plurality of double-sided semiconductor dies electrically coupled to one another to form a further semiconductor die stack, according to various embodiments.

FIG. 9D is a vertical cross-sectional view of a plurality of double-sided semiconductor dies electrically coupled to one another to form a further semiconductor die stack, according to various embodiments.

FIG. 9E is a vertical cross-sectional view of a plurality of double-sided semiconductor dies electrically coupled to one another to form a further semiconductor die stack, according to various embodiments.

FIG. 11 is a flowchart illustrating various operations of a method of forming a semiconductor device, according to various embodiments.

DETAILED DESCRIPTION

Figure 1:
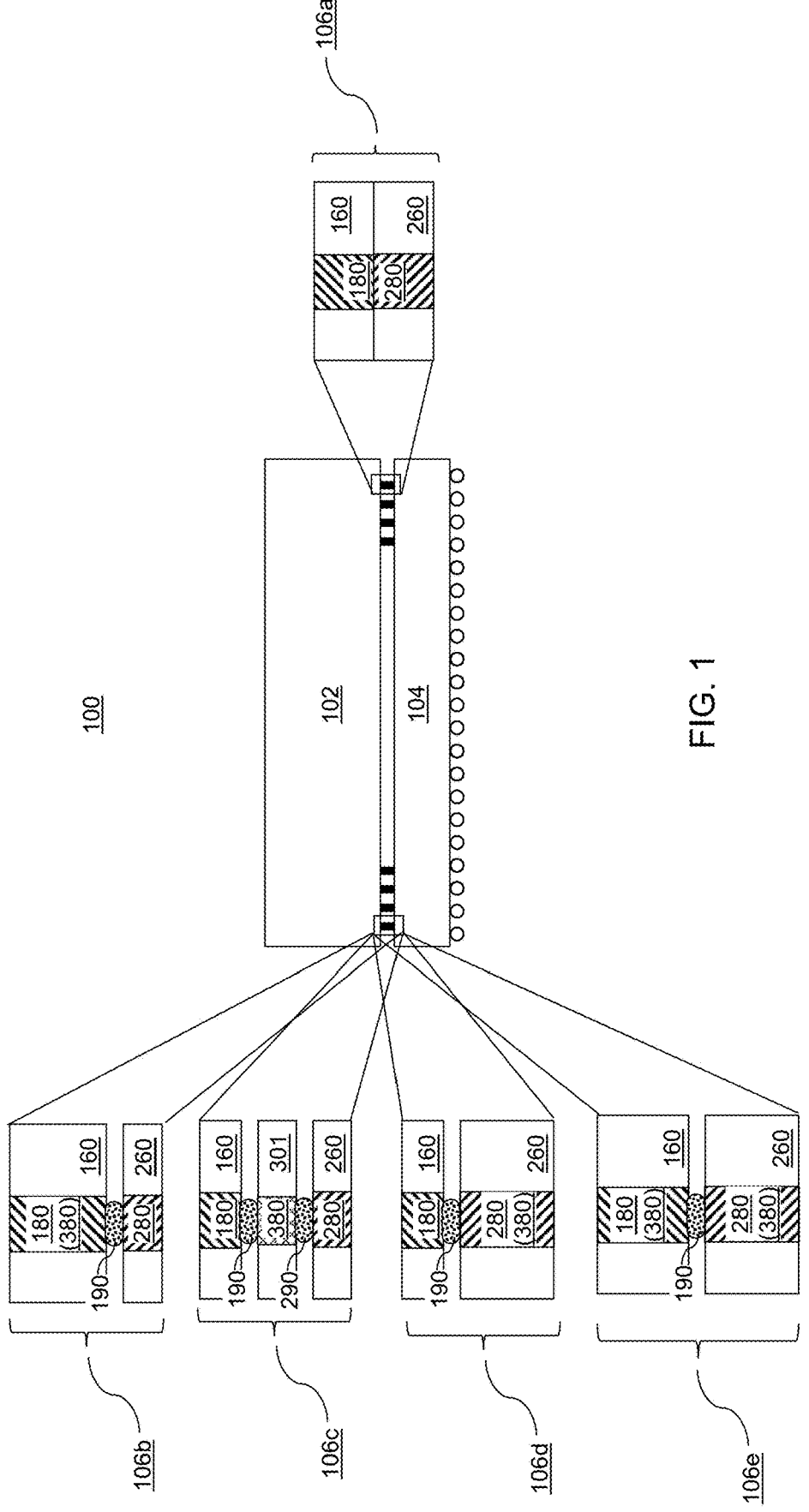
FIG. 1 is a vertical cross-sectional view of a chip assembly structure including a first semiconductor die and a second semiconductor die, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate. The semiconductor package typically includes a housing that encloses the IC dies to protect the IC dies from damage. The housing may also provide sufficient heat dissipation from the semiconductor package. In some instances, the semiconductor package may include a package lid that may include a thermally-conductive material (e.g., a metal or metal alloy, such as copper). The package lid may be located over the IC dies. Heat from the IC dies may be transferred from the upper surfaces of the IC dies into the package lid and may be ultimately dissipated to the environment. The heat may optionally be dissipated through a heat sink that may be attached to or may be integrally formed with the lid or through other components of the semiconductor package. Increasing complexity of semiconductor package devices gives rise to challenges related to the need to reduce ohmic loss to thereby reduce heat generation and signal propagation delay. To mitigate such issues, new designs are desired to reduce interconnect lengths by increasing package integration.

Various embodiments disclosed herein may provide advantages over existing semiconductor packages by using double-sided semiconductor dies that may each include a central portion formed in a front-end-of-line (FEOL) process disposed between a front-side interconnect structure, electrical circuits formed in a back-end-of-line (BEOL) process, and a back-side interconnect structure, also formed in a BEOL process. The FEOL electrical circuit components in each double-sided die may be configured to provide respective functionality (e.g., logic, memory, image processing, power delivery, analog circuits, etc.). Since different functionality may be provided by different semiconductor dies, the performance of a first semiconductor die may be optimized without regard to how a second semiconductor die may be optimized or to how the first semiconductor die optimization may be detrimental to the second semiconductor die and vice versa. Further, a standard layout of electrical bonding structures within front-side interconnect structures and back-side interconnect structures of different semiconductor dies may allow a wide variety of different types of semiconductor dies to be electrically connected to one another to form a chip assembly structure.

An embodiment semiconductor device may include a semiconductor die stack having a first semiconductor die including a first front-side interconnect structure and a first back-side interconnect structure, and a second semiconductor die including a second front-side interconnect structure and a second back-side interconnect structure, such that the first back-side interconnect structure is electrically connected to the second front-side interconnect structure. The first semiconductor die may include a first central portion disposed between the first front-side interconnect structure and the first back-side interconnect structure, the second semiconductor die may include a second central portion disposed between the second front-side interconnect structure and the second back-side interconnect structure, and each of the first central portion and second central portion may include electrical circuit elements formed in or on a semiconductor substrate. Each of the first front-side interconnect structure and second front-side interconnect structure as well as first back-side interconnect structure and second back-side interconnect structure may include interconnects formed within a dielectric layer.

An embodiment semiconductor package structure may include an interposer, a first die stack electrically connected to the interposer, and a second die stack electrically connected to the interposer. The first die stack and the second die stack may each include two or more semiconductor dies stacked such that a back-side interconnect structure of one semiconductor die may be electrically connected to a front-side interconnect structure of another semiconductor die. The first die stack may further include a first semiconductor die including a first front-side interconnect structure and a first back-side interconnect structure, and a second semiconductor die including a second front-side interconnect structure and a second back-side interconnect structure, such that the first back-side interconnect structure is electrically connected to the second front-side interconnect structure. The second die stack may further include a third semiconductor die including a third front-side interconnect structure and a third back-side interconnect structure, and a fourth semiconductor die including a fourth front-side interconnect structure and a fourth back-side interconnect structure, such that the third back-side interconnect structure is electrically connected to the fourth front-side interconnect structure.

An embodiment method of forming a semiconductor device may include forming a first semiconductor die including a first front-side interconnect structure and a first back-side interconnect structure; forming a second semiconductor die including a second front-side interconnect structure and a second back-side interconnect structure; and electrically connecting the first back-side interconnect structure to the second front-side interconnect structure. According to the method, forming each of the first semiconductor die and the second semiconductor die may further include forming a central portion including electrical circuit elements in or on a semiconductor substrate in a front-end-of-line process; performing a first back-end-of-line process to form a front-side interconnect structure in a first dielectric layer; and performing a second back-end-of-line process to form a back-side interconnect structure in a second dielectric layer. The method may be performed such that the central portion is disposed between the front-side interconnect structure and the back-side interconnect structure.

Various embodiment structures and methods disclosed herein may be used to form a chip assembly structure in which various circuits (e.g., a memory array and a peripheral circuit controlling operation of the memory array) may be implemented in different semiconductor dies. Embodiment semiconductor dies may be formed to have a double-sided configuration including a central portion disposed between a front-side interconnect structure and a back-side interconnect structure, as described in greater detail (e.g., see FIGS. 3A to 3C and related description, below). The central portion may be implemented in a FEOL process that generates circuit elements in or on a semiconductor substrate. Each of the front-side interconnect structure and the back-side interconnect structure may be formed in respective BEOL processes such that the front-side interconnect structure and the back-side interconnect structure each include electrical interconnects formed within respective dielectric layers.

As used herein, a "back-end-of-line" component or a "BEOL" component refers to any component that is formed at a contact level or at a metal interconnect level. A "metal interconnect level" refers to a level through which a metal interconnect structure, such as a metal line or a metal via structure, vertically extends. As used herein, a "front-end-of-line" component or an "FEOL" component refers to any component that is formed prior to formation of any contact level structure, if followed by formation of contact level structures, or without formation of any contact level structure or any metal interconnect structure (i.e., not followed by formation of any contact level structure or any metal interconnect structure).

In general, FEOL components refer to semiconductor device components that may be formed during a CMOS manufacturing process prior to formation of any contact via structure on nodes of field effect transistors, and BEOL components refer to semiconductor device components that may be formed during a CMOS manufacturing process during, or after, the earliest contact via formation process that forms contact via structures on nodes of field effect transistors. In embodiments in which any unconventional manufacturing steps are integrated into a CMOS manufacturing process, a component formed prior to formation of any contact via structure on nodes of field effect transistors may be referred to as an FEOL component, and a component formed during, or after, the earliest contact via formation process that forms contact via structures on nodes of field effect transistors may be referred to as a BEOL component.

Generally, an FEOL component may be formed within a semiconductor substrate, directly on a semiconductor substrate, or indirectly on a semiconductor substrate without any intervening metal interconnect structure between the semiconductor substrate and the component. Examples of the FEOL components include planar field effect transistors using a portion of the semiconductor substrate as a portion of a channel, fin field effect transistors (FinFET), gate-all-around field effect transistors, and any device component that includes a portion of a semiconductor substrate that has a lateral extent greater than the lateral extent of the respective device component. Typically, for each FEOL component, no metal interconnect structure vertically extends from a first horizontal plane including a top surface of the FEOL component to a second horizontal plane including a bottom surface of the FEOL component, or the FEOL component contacts, or is laterally surrounded by, a semiconductor material layer having a greater lateral extent than the FEOL component.

Examples of the BEOL components may include any dielectric material layer embedding a metal via structure or embedding a metal line structure, any metal interconnect structure, memory cells formed without using any portion of a semiconductor substrate, selector cells formed without using any portion of a semiconductor substrate, thin film transistors formed without using any portion of a semiconductor substrate (but may include patterned semiconductor material portions having a lateral extent that does not exceed the lateral extent of an individual thin film transistor or a cluster of merged thin film transistors), and bonding pads. Typically, for each BEOL component, at least one metal interconnect structure vertically extends from a first horizontal plane including a top surface of the BEOL component to a second horizontal plane including a bottom surface of the BEOL component, and the BEOL component does not contact, and is not laterally surrounded by, a semiconductor material layer having a greater lateral extent than the BEOL component.

As mentioned above, a chip assembly structure may include a semiconductor die stack that includes two or more double-sided semiconductor dies, each having a central portion (formed in a FEOL process) disposed between a front-side interconnect structure and a back side interconnect structure (formed in respective BEOL processes). For example, a die stack may include a first double-sided semiconductor die and a second double-sided semiconductor die. The first semiconductor die may include a first front-side interconnect structure and a first back-side interconnect structure, and the second semiconductor die may include a second front-side interconnect structure and a second back-side interconnect structure. The first semiconductor die and the second semiconductor die may be electrically connected to one another by electrically connecting the first back-side interconnect structure of the first semiconductor die to the second front-side interconnect structure of the second semiconductor die.

The first semiconductor die and the second semiconductor die may be integrated into a chip assembly structure using a die-to-die connection, which may be implemented using a hybrid bonding process. The hybrid bonding process may generate direct metal-to-metal bonds between first electrical bonding structures of the first back-side interconnect structure and second electrical bonding structures of the second front-side interconnect structure. The hybrid bonding process may further generate direct dielectric-to-dielectric bonds between a first dielectric layer of the first back-side interconnect structure and a second dielectric layer of the second front-side interconnect structure. Various other bonding structures may be used to form the die-to-die connection, as described in greater detail below.

In further embodiments, a chip assembly structure may be formed from three or more double-sided semiconductor dies. For example, a first semiconductor die may include logic circuits, a second semiconductor die may include memory circuits, and a third semiconductor die may include additional logic circuits, additional memory circuits, image processing circuits, power delivery circuits, analog circuits, passive device components, thermal dispersion components (e.g., a heat pipe), etc. In other embodiments, a chip assembly structure may include a die stack including four or more double-sided semiconductor dies. The die stack may be electrically connected to an interposer or package substrate to form a semiconductor package structure. In further embodiments, the semiconductor package structure may include two or more die stacks electrically connected to the interposer or package substrate.

As mentioned above, and described in greater detail below, each of the various double-sided semiconductor dies may include circuit elements formed in a central portion in or on a semiconductor substrate, while the front-side interconnect structure and the back-side interconnect structure may be free of any front-end-of-line device components such as a semiconductor substrate. In some embodiments, one or both of the front-side interconnect structure and the back-side interconnect structure may include additional BEOL circuit components such as at least one BEOL memory circuit, at least one BEOL logic circuit, etc.

Each of the double-sided semiconductor dies in a chip stack may include FEOL circuit components configured to provide respective functionality (e.g., logic, memory, image processing, power delivery, analog circuits, etc.). Since different functionality may be provided by different semiconductor dies, a set of processing steps that may be used to manufacture a first semiconductor die (e.g., a memory die) and a set of processing steps that may be used to manufacture a second semiconductor die (e.g., a logic die) may be selected independently. As such, the performance of the first semiconductor die may be optimized without regard to how the second semiconductor die may be optimized and/or without regard to how the optimization of the first semiconductor die may negatively impact the second semiconductor die or vice versa.

For example, a memory die may be optimized with a focus on the density of the memory cells, and a logic die may be optimized with a focus on the device speed, reduction of the process variability, and reliability of semiconductor devices during operation (including, but not limited to, reliability of the device with respect to power supply voltage variation).

Separate manufacturing processes and optimizations of the various semiconductor dies in a semiconductor die stack may allow a chip assembly structure to be produced at lower cost and with improved performance relative to semiconductor devices manufactured using other methods. Further, the use of double-sided semiconductor die having a BEOL front-side interconnect structure and a BEOL back-side interconnect structure may simplify die-to-die connections between dies and may provide greater flexibility in the types of semiconductor dies that may be combined to form a die stack. For example, a standard layout of electrical bonding structures within front-side interconnect structures and back-side interconnect structures of different semiconductor dies may allow a wide variety of different types of semiconductor dies to be electrically connected to one another to form a chip assembly structure.

FIG. 1 is a vertical cross-sectional view of chip assembly structure 100 including a first semiconductor die 102 and a second semiconductor die 104, according to various embodiments. The first semiconductor die 102 may be configured as a memory die (not expressly shown) including an array of memory cells and metal interconnect structures that are electrically connected to respective nodes of the memory cells. The second semiconductor die 104 may be configured as a control-circuit-containing die, which may include a control circuit. The control circuit may include field effect transistors which are configured to control operation of the array of memory cells in the memory array of the first semiconductor die 102. Each of the first semiconductor die 102 and the second semiconductor die 104 may be configured as a double-sided semiconductor die, as described in greater detail with reference to FIGS. 3A to 3C, below.

The first semiconductor die 102 may be electrically connected to the second semiconductor die 104 using various types of die-to-die bonding, as indicated by the various bonding configurations (106a, 106b, 106c, 106d, 106e) shown in FIG. 1. In an example embodiment, the first semiconductor die 102 may include first bonding structures 180 and the second semiconductor die 104 may include second bonding structures 280. In an embodiment in which the first semiconductor die 102 is configured as a memory die, at least a subset of the first bonding structures 180 may be electrically connected to metal interconnect structures in the memory die. As shown, the first bonding structures 180 may be laterally surrounded by a first bonding-level dielectric layer 160, which may include a dielectric material that may provide dielectric-to-dielectric bonding (such as silicon oxide) or may include a passivation dielectric material (such as silicon nitride or silicon carbide nitride). Similarly, the second bonding structures 280 may be embedded within a second bonding-level dielectric layer 260.

According to an embodiment, die-to-die bonding between the first semiconductor die 102 and the second semiconductor die 104 may be implemented using metal-to-metal bonding (e.g., see bonding configuration 106a) or through-substrate-via-mediated bonding (e.g., see bonding configurations 106b, 106c, 106d, and 106e). As used herein, a "metal-to-metal bonding" refers to a bonding method and a bonded structure in which bonded structures are formed by direct contact between a first metal surface (e.g., first bonding structure 180 in bonding configuration 106a) and a second metal surface (e.g., second bonding structure 280 in bonding configuration 106a) and interdiffusion of metal atoms across a bonding interface between the first metal surface and the second metal surface. An exemplary metal-to-metal bonding is copper-to-copper bonding. In embodiments in which the die-to-die bonding uses metal-to-metal bonding, the first bonding structures 180 (e.g., formed as first copper bonding pads) are directly bonded to the second bonding structures 280 (e.g., formed as second copper bonding pads).

In one embodiment, dielectric bonding between mating pairs (160, 260) of dielectric material layers may be used in conjunction with metal-to-metal bonding. This type of bonding (i.e., having metal-to-metal bonding and dielectric-to-dielectric bonding) may be herein referred to as hybrid bonding. In embodiments in which hybrid bonding is used (e.g., see bonding configuration 106a), the first bonding-level dielectric layer 160 may be bonded to the second bonding-level dielectric layer 260 by dielectric-to-dielectric bonding such as silicon oxide-to-silicon oxide bonding.

As used herein, "through-substrate-via-mediated bonding" refers to a bonding method or a bonding structure in which an array of through-substrate via (TSV) structures 380, vertically extending through an embedding matrix material (160 and/or 260), is used to provide bonding between the first semiconductor die 102 and the second semiconductor die 104. In a first example embodiment, as shown in bonding configuration 106b of FIG. 1, the array of TSV structures 380 may include the first bonding structures 180. In other words, the first bonding structures 180 may be formed as the array of TSV structures 380. In this embodiment, an array of solder material portions 190 may be used to provide bonding between the first bonding structures 180 (which are the TSV structures 380) and the second bonding structures 280. In a second example embodiment, as shown in bonding configuration 106c, a substrate 301 including an array of TSV structures 380 may be provided. A first array of solder material portions 190 may be used to attach the first bonding structures 180 to the array of TSV structures 380, and a second array of solder material portions 290 may be used to attach the second bonding structures 280 to the array of TSV structures 380.

In a third example embodiment, as shown in bonding configuration 106d, the array of TSV structures 380 may include the second bonding structures 280. In other words, the second bonding structures 280 may be formed as the array of TSV structures 380. In this embodiment, an array of solder material portions 190 may be used to provide bonding between the first bonding structures 180 and the second bonding structures 280 (which are the TSV structures 380). In a fourth example embodiment, as shown in bonding configuration 106d, each of the first bonding structures 180 and the second bonding structures 280 may be formed as respective arrays of TSV structures 380. In this embodiment, an array of solder material portions 190 may be used to provide bonding between the first bonding structures 180 (which are formed as TSV structures 380) and the second bonding structures 280 (which are also formed as TSV structures 380).

In embodiments in which the first semiconductor die 102 is configured as a memory die and the second semiconductor die 104 is configured as a control control-circuit-containing die, electrical nodes of the memory die may be connected to electrical nodes of the control-circuit-containing die through metal-to-metal bonding between mating pairs of bonding structures (180, 280), as shown in bonding configuration 106a, or through an array of TSV structures 380, as shown in bonding configurations 106b, 106c, 106d, and 106e.

The electrical connections may be provided for all bit lines and for all word lines in the memory array within the memory die (e.g., semiconductor die 102), and the control-circuit-containing die (e.g., semiconductor die 104) may include the entirety of the control circuit for the memory die. For example, the control-circuit-containing die may include all peripheral circuits including, but not limited to, bit line drivers, word line drivers, sense amplifiers, design-for-testability (DFT) circuits, scan chain circuits, built-in-self-test (BIST) circuits, error correction circuits (ECCs), phase-locked loop (PLL) circuits, electrically-programmable fuse (e-Fuse) circuits, input/output (IO) circuits, voltage generator (power supply) circuits, etc.

Generally, the front side (i.e., the bottom side in the embodiment of FIG. 1) or the backside (i.e., the top side in the embodiment of FIG. 1) of the first semiconductor die 102 may be used to form the first bonding structures 180. Likewise, the front side (i.e., the bottom side) or the backside (i.e., the top side) of the second semiconductor die 104 may be used to form the second bonding structures 280. As such, front-to-front bonding, front-to-back bonding, back-to-front bonding, or back-to-back bonding may be used to bond the second semiconductor die 104 to the first semiconductor die 102. Further, in some embodiments, at least one additional structure may be integrated into the first semiconductor die 102 in addition to the memory die, which may include at least one BEOL structure such as a memory die, logic die, etc.

Figure 2:
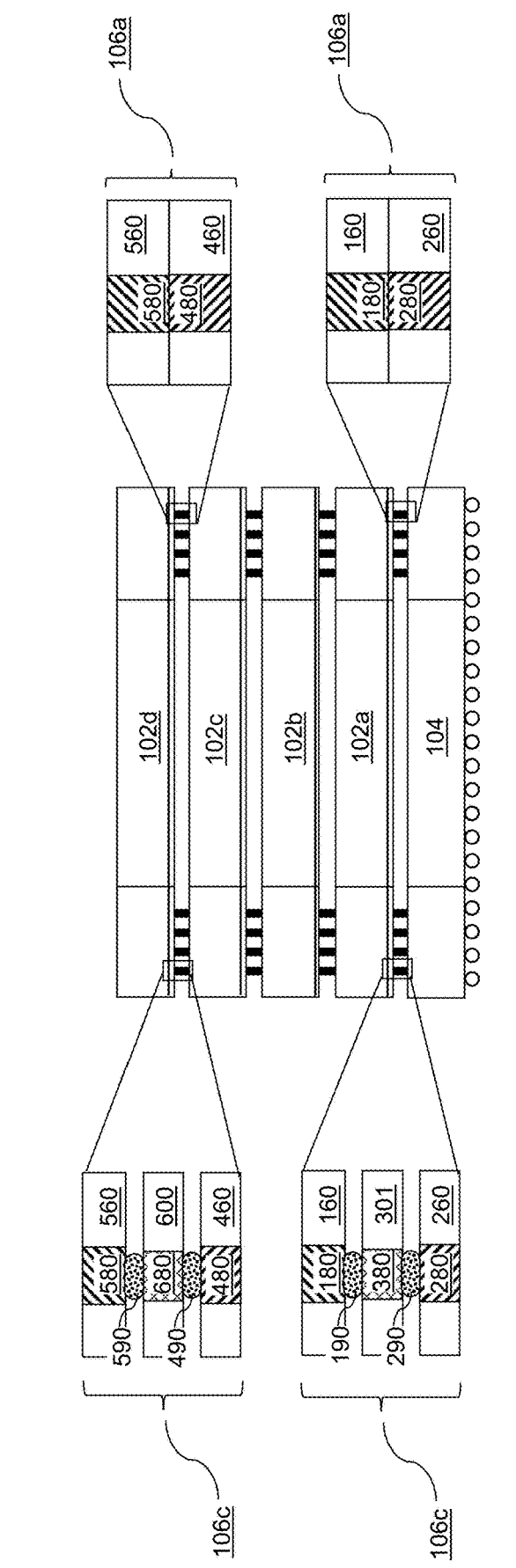
FIG. 2 is a vertical cross-sectional view of a chip assembly structure including five semiconductor dies, according to various embodiments.

FIG. 2 is a vertical cross-sectional view of a chip assembly structure 200 including five semiconductor dies (102a, 102b, 102c, 102d, 104), according to various embodiments. As shown, the chip assembly structure 200 may include four first semiconductor dies (102a, 102b, 102c, 102d) that may provide a first functionality and a second semiconductor die 104 that may provide a second functionality. For example, the four first semiconductor dies (102a, 102b, 102c, 102d) may provide memory functionality with each of the four semiconductor dies (102a, 102b, 102c, 102d) configured to provide different levels of memory (e.g., level-1 cache, level-2 cache, etc.). As in the embodiment described above with reference to FIG. 1, the second semiconductor die 104 may provide control circuits that may be configured to control the four first semiconductor dies (102a, 102b, 102c, 102d).

Each of the first semiconductor dies (102a, 102b, 102c, 102d) may be vertically stacked and may be interconnected to one another. Each of the first semiconductor dies (102a, 102b, 102c, 102d) may include a respective memory array, such as a two-dimensional memory array or a three-dimensional memory array formed within a respective set of dielectric material layers. The bottommost first semiconductor die 102a may include die-to-die connection interconnect structures (including the first bonding structures 180 that are embedded within first bonding-level dielectric material layers 160). The first bonding structures 180 may be bonded to the second bonding structures 280 (embedded within a second bonding-level dielectric layer 260) in any bonding configuration (106a, 106b, 106c, 106d, 106e) described above with reference to FIG. 1. For example, the first bonding structures 180 may be bonded to the second bonding structures 280 in the bonding configuration 106a as shown in the lower right of FIG. 2, or the bonding configuration 106c, as shown in the lower left portion of FIG. 2. In this way, each vertically neighboring pair of first semiconductor dies (102a, 102b, 102c, 102d) may be interconnected to one another through additional die-to-die connection structures.

For example, a first one of the first semiconductor dies (102a, 102b, 102c, 102d) within each vertically-neighboring pair of first semiconductor dies (102a, 102b, 102c, 102d) may include third bonding structures 480 that are embedded in a third bonding-level dielectric layer 460, and a second one of the first semiconductor dies (102a, 102b, 102c, 102d) within each vertically-neighboring pair of the first semiconductor dies (102a, 102b, 102c, 102d) may include fourth bonding structures 580 that are embedded in a fourth bonding-level dielectric layer 560. The third bonding structures 480 may be bonded to the fourth bonding structures 580 through metal-to-metal bonding, as indicated by bonding configuration 106a, or through-substrate-via-mediated bonding, according to bonding configuration 106c. According to bonding configuration 106a, the third bonding structures 480 may be bonded to the fourth bonding structures 580 through metal-to-metal bonding, and the third bonding-level dielectric layer 460 may be bonded to the fourth bonding-level dielectric layer 560 through dielectric bonding. In one embodiment, one, a plurality, or each, of the vertically neighboring pairs of first semiconductor dies (102a, 102b, 102c, 102d) may be bonded via hybrid bonding (i.e., metal-to-metal and dielectric-to-dielectric bonding).

Alternatively, or additionally, one, a plurality, or each, of the vertically neighboring pairs of first semiconductor dies (102a, 102b, 102c, 102d) may be bonded via through-substrate-via-mediated bonding according to bonding configurations (106b, 106c, 106d, 106e), as described above with reference to FIG. 1. For example, a substrate 600 including an array of TSV structures 680 may be provided, a third array of solder material portions 490 may be used to attach the third bonding structures 480 to the array of TSV structures 680, and a fourth array of solder material portions 590 may be used to attach the fourth bonding structures 580 to the array of TSV structures 680, according to bonding configuration 106c. In another illustrative example, the array of TSV structures 680 may include the third bonding structures 480 (not shown). In other words, the third bonding structures 480 may be formed as the array of TSV structures 680 (similar to bonding configuration 106d in FIG. 1). In this embodiment, an array of solder material portions 490 may be used to provide bonding between the third bonding structures 480 (which are the TSV structures 680) and the fourth bonding structures 580.

In yet another illustrative example, the array of TSV structures 680 may include the fourth bonding structures 580 (not shown). In other words, the fourth bonding structures 580 may be formed as the array of TSV structures 680 (similar to bonding configuration 106b of FIG. 1). In this embodiment, an array of solder material portions 490 may be used to provide bonding between the third bonding structures 480 and the fourth bonding structures 580 (which are the TSV structures 680). Lastly, as described above with reference to FIG. 1, each of the bonding structures 480 and the fourth bonding structures 580 may be formed as TSV structures (similar to bonding configuration 106e of FIG. 1).

Figures 3A, 3B, 3C:
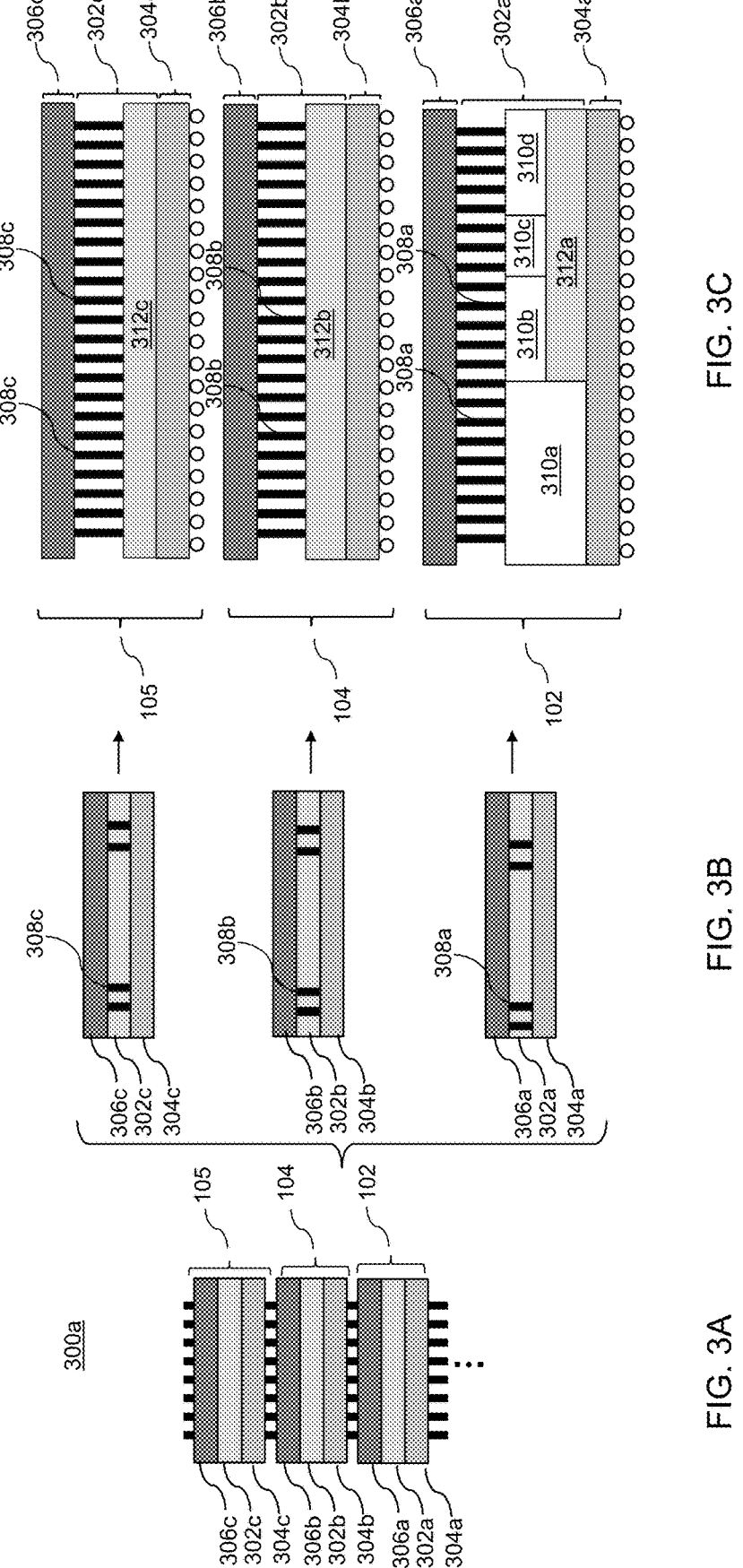
FIG. 3A is a vertical cross-sectional view of a die stack that may form a portion of a chip assembly structure, according to various embodiments.
FIG. 3B is a vertical cross-sectional view of the semiconductor dies in the die stack of FIG. 3A, according to various embodiments.
FIG. 3C is a vertical cross-sectional enlarged view of the semiconductor dies in the die stack of FIG. 3A, according to various embodiments.

FIG. 3A is a vertical cross-sectional view of a die stack 300a that may form a portion of a chip assembly structure, according to various embodiments. The die stack 300a may include a first semiconductor die 102, a second semiconductor die 104, and a third semiconductor die 105. As described above, the semiconductor dies (102, 104, 105) may provide various functionalities. For example, one or more of the semiconductor dies (102, 104, 105) may be configured as a memory die and one or more others of the semiconductor dies (102, 104, 105) may include control circuits that may be configured to control other semiconductor dies.

As shown, each of the semiconductor dies (102, 104, 105) may be configured as double-sided dies. In this regard, each of the semiconductor dies (102, 104, 105) may include a central portion (302a, 302b, 302c) disposed between a front-side interconnect structure (304a, 304b, 304c) and a back-side interconnect structure (306a, 306b, 306c). As mentioned above, and described in greater detail below, the central portion (302a, 302b, 302c) may be formed in FEOL process and may include electrical circuit elements formed in or on a semiconductor substrate (e.g., see FIG. 6A). Each of the front-side interconnect structure (304a, 304b, 304c) and the back-side interconnect structure (306a, 306b, 306c) may be formed in a BEOL process and may include electrical interconnects formed within respective dielectric layers (e.g., see FIG. 6F). Further, the semiconductor dies (102, 104, 105) may be electrically connected to one another using any of the bonding configurations (106a, 106b, 106c, 106d, 106e) described above with reference to FIGS. 1 and 2.

For example, the first semiconductor die 102 may include a first front-side interconnect structure 304a and a first back-side interconnect structure 306a, and the second semiconductor die 104 may include a second front-side interconnect structure 304b and a second back-side interconnect structure 306b. The first back-side interconnect structure 306a may be electrically connected to the second front-side interconnect structure 304b, as shown in FIG. 3A. Each of the first front-side interconnect structure 304a, the first back-side interconnect structure 306a, the second front-side interconnect structure 304b, and the second back-side interconnect structure 306b may include electrical interconnects formed within a dielectric layer (160, 260) (e.g., as described below with reference to FIGS. 6D and 6F).

As described above with reference to FIGS. 1 and 2, the first back-side interconnect structure 306a may be electrically connected to the second front-side interconnect structure 304b with hybrid bonding structures in which first electrical bonding structures 180 of the first back-side interconnect structure 306a may be bonded to second electrical bonding structures 280 of the second front-side interconnect structure 304b with direct metal-to-metal bonds (e.g., see FIGS. 1 and 2 and related description, above). Further, the first back-side interconnect structure 306a (e.g., having first electrical bonding structures 180) may be formed in a first dielectric layer 160 and the second front-side interconnect structure 304b (e.g., having second electrical bonding structures 280) may be formed in a second dielectric layer 260, and the hybrid bonding structures may further include direct dielectric-to-dielectric bonds between the first dielectric layer 160 and the second dielectric layer 260 (e.g., see bonding configuration 106a in FIGS. 1 and 2). In various embodiments, the first electrical bonding structures 180 and the second electrical bonding structures 280 may be configured as a periodic array having a pitch that is in a range from 0.1 microns to 10 microns.

As shown in FIG. 3A, the die stack 300a may further include a third semiconductor die 105 that may include a third front-side interconnect structure 304c and a third back-side interconnect structure 306c. The third semiconductor die 105 may be electrically connected to the second semiconductor die 104 using any of the bonding configurations (106a, 106b, 106c, 106d, 106e) described above with reference to FIGS. 1 and 2. For example, the second back-side interconnect structure 306b of the second semiconductor die 104 may be electrically connected to the third front-side interconnect structure 304c of the third semiconductor die 105.

Further, as described above, each of the first semiconductor die 102, the second semiconductor die 104, and the third semiconductor die 105 may provide the same or different functionalities. For example, the first semiconductor die 102 may include first logic circuits and the second semiconductor die 104 may include first memory circuits, or vice-versa. In various embodiments, the third semiconductor die 105 may include one of second logic circuits, second memory circuits, image processing circuits, power delivery circuits, analog circuits, passive device components, thermal dispersion components (e.g., a heat pipe), etc. Further, at least one of the first semiconductor die 102, the second semiconductor die 104, and the third semiconductor die 105 may correspond to a different technology node than another of the first semiconductor die 102, the second semiconductor die 104, and the third semiconductor die 105.

FIGS. 3B and 3C are vertical cross-sectional views of the semiconductor dies (102, 104, 105) in the die stack 300a of FIG. 3A, according to various embodiments. As shown, each of the semiconductor dies (102, 104, 105) may include TSV structures (308a, 308b, 308c). The TSV structures (308a, 308b, 308c) may be configured to electrically connect the front-side interconnect structures (304a, 304b, 304c) to the back-side interconnect structure (306a, 306b, 306c). For example, the first central portion 302a may include first vias 308a that electrically connect the first front-side interconnect structure 304a to the first back-side interconnect structure 306a, and the second central portion 302b may include second vias 308b that electrically connect the second front-side interconnect structure 304b to the second back-side interconnect structure 306b. Similarly, the third central portion 302c may include third vias 308c that electrically connect the third front-side interconnect structure 304c to the back-side interconnect structure 306c. As shown in FIG. 3C, the TSV structures (308a, 308b, 308c) may be formed in a substrate portion of the respective central portions (302a, 302b, 302c), as described in greater detail with reference to FIGS. 6A to 6F.

The central portions (302a, 302b, 302c) of the respective semiconductor dies (102, 104, 105) may have various different electrical circuit components that provide respective functionalities. For example, the first central portion 302a may include control circuits (310a, 310b, 310c, 310d), for example, including an input/output circuit 310a including a voltage generator, a first word line driver 310b having a first multiplexer, a logic circuit 310c, a second word line driver 310d having a second multiplexer, etc. The first central portion 302a may further include a first memory array 312a. A first memory array 312a may be formed at a substrate level in an FEOL process. In other embodiments, the first memory array 312a may be formed in BEOL process as part of the first front-side interconnect structure 304a (not expressly shown in FIG. 3C. The second central portion 302b and the third central portion 302c may respectively include a second memory array 312b and a third memory array 312c that may each be formed at a substrate level in an FEOL process. The above-described example embodiment, in which the first semiconductor die 102 includes control circuitry, and the second and third semiconductor dies (104, 105) provide memory functionality, is provided merely as an example. In other embodiments, many other types of die stacks may be manufactured by combining a variety of different types of semiconductor dies, as described in greater detail with reference to FIGS. 7A to 10, below.

Figures 4E, 4F, 4G, 4H:
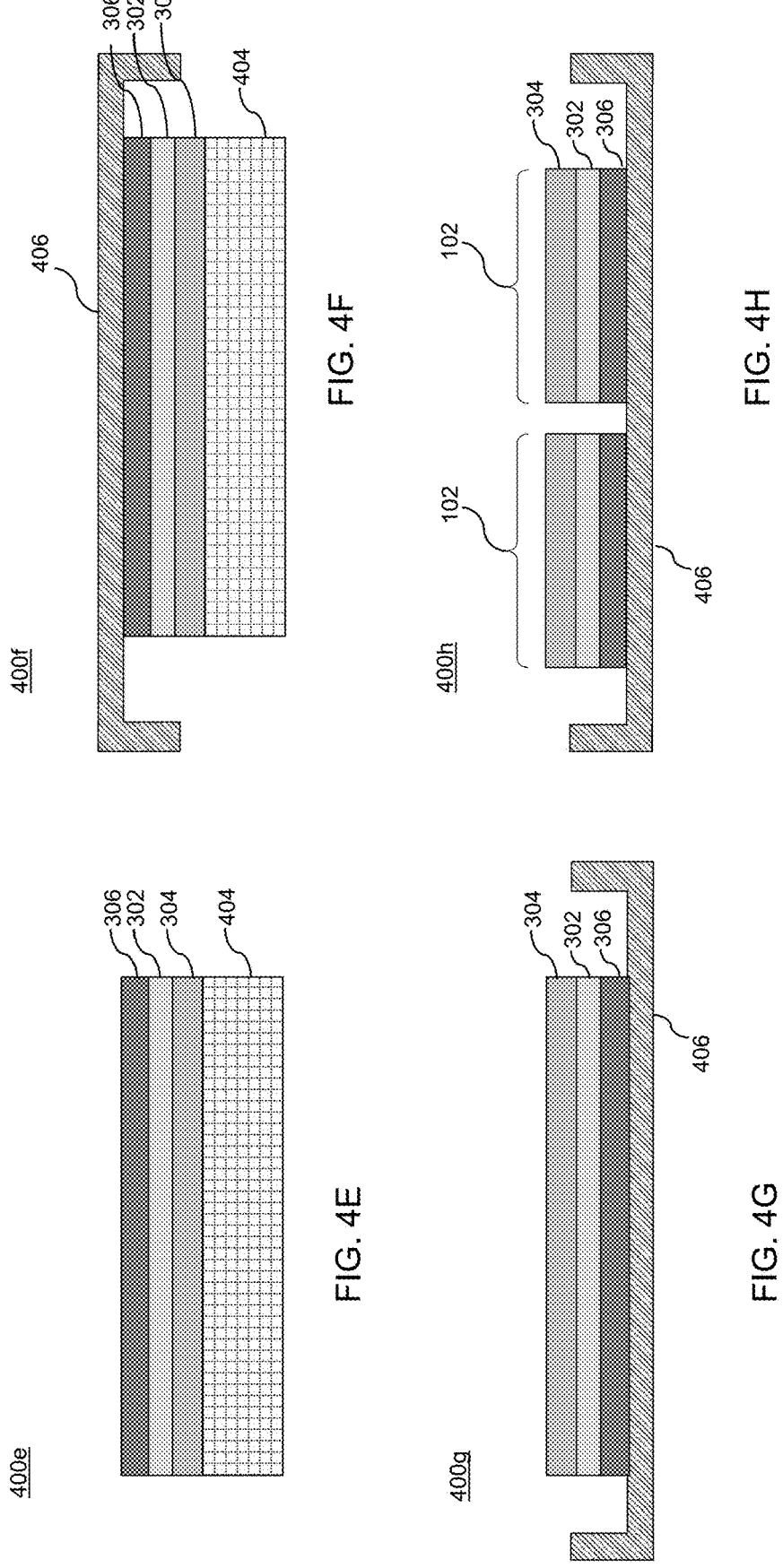
FIG. 4E is a vertical cross-sectional view of a further intermediate structure that may be used in the formation of one or more double-sided semiconductor dies, according to various embodiments.
FIG. 4F is a vertical cross-sectional view of a further intermediate structure that may be used in the formation of one or more double-sided semiconductor dies, according to various embodiments.
FIG. 4G is a vertical cross-sectional view of a further intermediate structure that may be used in the formation of one or more double-sided semiconductor dies, according to various embodiments.
FIG. 4H is a vertical cross-sectional view of a structure including two double-sided semiconductor dies supported on a dicing frame, according to various embodiments.

FIGS. 4A to 4G are vertical cross-sectional views of respective intermediate structures 400a to 400g that may be used in the formation of one or more double-sided semiconductor dies (e.g., first semiconductor dies 102), and FIG. 4H is a vertical cross-sectional view of a structure including two double-sided semiconductor dies (e.g., first semiconductor dies 102) supported on a dicing frame 406, according to various embodiments. The intermediate structure 400a of FIG. 4A may include a semiconductor substrate 402 having a central portion 302 formed thereon. The semiconductor substrate 402 may include a bulk semiconductor substrate such as a silicon substrate in which the semiconductor material layer continuously extends from a top surface of the semiconductor substrate 402 to a bottom surface of the semiconductor substrate 402, or a semiconductor-on-insulator layer including a semiconductor material layer as a top semiconductor layer overlying a buried insulator layer (such as a silicon oxide layer). The central portion 302 may include various semiconductor devices such as field effect transistors (FETs) that may be formed on, and/or in, the semiconductor substrate 402 during a FEOL operation.

FIG. 4B is a vertical cross-sectional view of a further intermediate structure 400b that may be used in the formation of one or more double-sided semiconductor dies (e.g., first semiconductor dies 102), according to various embodiments. The intermediate structure 400b may be formed from the intermediate structure 400a of FIG. 4A by forming a front-side interconnect structure 304 over, and electrically connected to, the central portion 302. The front-side interconnect structure 304 may be formed to include one or more layers of interconnect structures. The interconnect structures may be formed in an interlayer dielectric layer (not shown) and may include a metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure.

FIG. 4C is a vertical cross-sectional view of a further intermediate structure 400c that may be used in the formation of one or more double-sided semiconductor dies (e.g., first semiconductor dies 102), according to various embodiments. The intermediate structure 400c, may be formed from the intermediate structure 400b of FIG. 4B by attaching a first carrier substrate 404 to the front-side interconnect structure 304 of the intermediate structure 400b of FIG. 4B.

The first carrier substrate 404 may include an optically transparent substrate such as a glass substrate or a sapphire substrate. A thickness of the first carrier substrate 404 may be in a range from 500 microns to 2,000 microns, although lesser and greater thicknesses may also be used. An adhesive layer (not shown) may be applied to a surface of the first carrier substrate 404, and the adhesion layer may make contact with the front-side interconnect structure 304 to thereby attach the first carrier substrate 404 to the front-side interconnect structure 304. In one embodiment, the adhesive layer may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the adhesive layer may include a thermally decomposing adhesive material. For example, the adhesive layer may include an acrylic pressure-sensitive adhesive that decomposes at an elevated temperature. The debonding temperature of the thermally decomposing adhesive material may be in a range from 150 degrees to 200 degrees Celsius.

FIGS. 4D and 4E are vertical cross-sectional views of respective intermediate structures 400d and 400e that may be used in the formation of one or more double-sided semiconductor dies, according to various embodiments. The intermediate structure 400d may be formed from the intermediate structure 400c of FIG. 4C by removing the semiconductor substrate 402. The semiconductor substrate 402 may be removed, for example, by etching and/or by mechanically removal such as by grinding. The intermediate structure 400e may be formed from the intermediate structure 400d by forming back-side interconnect structure 306 over the central portion 302. In this regard, the back-side interconnect structure 306 may be formed as one or more interconnect structures formed in an interlayer dielectric layer in a BEOL process, as described in greater detail with reference to FIGS. 6E and 6F, below.

FIGS. 4F, 4G, and 4H are vertical cross-sectional views of respective intermediate structures 400f, 400g, and 400h that may be used in the formation of one or more double-sided semiconductor dies (e.g., first semiconductor dies 102), according to various embodiments. The intermediate structure 400f may be formed from the intermediate structure 400e by mounting a dicing frame 406 to the intermediate structure 400e of FIG. 4E. In this regard, the dicing frame 406 may be mounted to a surface of the back-side interconnect structure 306. The dicing frame 406 may be mounted to the intermediate structure 400e using an adhesive layer (not shown). For example, a first side of a double-sided adhesive tape or film may be applied to the back-side interconnect structure 306 to thereby attach the intermediate structure 400e to the first side of the adhesive tape or film. A second side of the adhesive tape or film may then be applied to a surface of the dicing frame 406 to thereby attach the back-side interconnect structure 306 to the dicing frame 406.

The intermediate structure 400g of FIG. 4G may be formed from the intermediate structure 400f by removing the first carrier substrate 404. The adhesive layer (formed between the first carrier substrate 404 and the front-side interconnect structure 304 back-side interconnect structure 306) may be decomposed by ultraviolet radiation or by a thermal anneal at a debonding temperature. In embodiments in which the first carrier substrate 404 includes an optically transparent material and the adhesive layer includes an LTHC layer, the adhesive layer may be decomposed by irradiating ultraviolet light through the transparent first carrier substrate 404. The LTHC layer may absorb the ultraviolet radiation and may generate heat, which decomposes the material of the LTHC layer and cause the transparent first carrier substrate 404 to be detached from the back-side interconnect structure 306. In embodiments in which the adhesive layer includes a thermally decomposing adhesive material, a thermal anneal process at a debonding temperature may be performed to detach the first carrier substrate 404 from the front-side interconnect structure 304.

FIG. 4H is a vertical cross-sectional view of a structure 400h including two first semiconductor dies 102 supported on the dicing frame 406, according to various embodiments. In this embodiment, the first semiconductor dies 102 may be formed as double-sided semiconductor dies. The structure 400h may be formed by dicing the intermediate structure 400g of FIG. 4G to thereby singulate the intermediate structure 400g into a plurality of individual first semiconductor dies 102. In this example embodiment, the process of dicing the intermediate structure 400g generates two first semiconductor dies 102. Various other numbers of first semiconductor dies 102 may be generated in other embodiments. The first semiconductor dies 102 may then be removed from the dicing frame 406 and may be used to form various die stacks, as described in greater detail with reference to FIGS. 7A to 10, below.

Figures 5A, 5B:
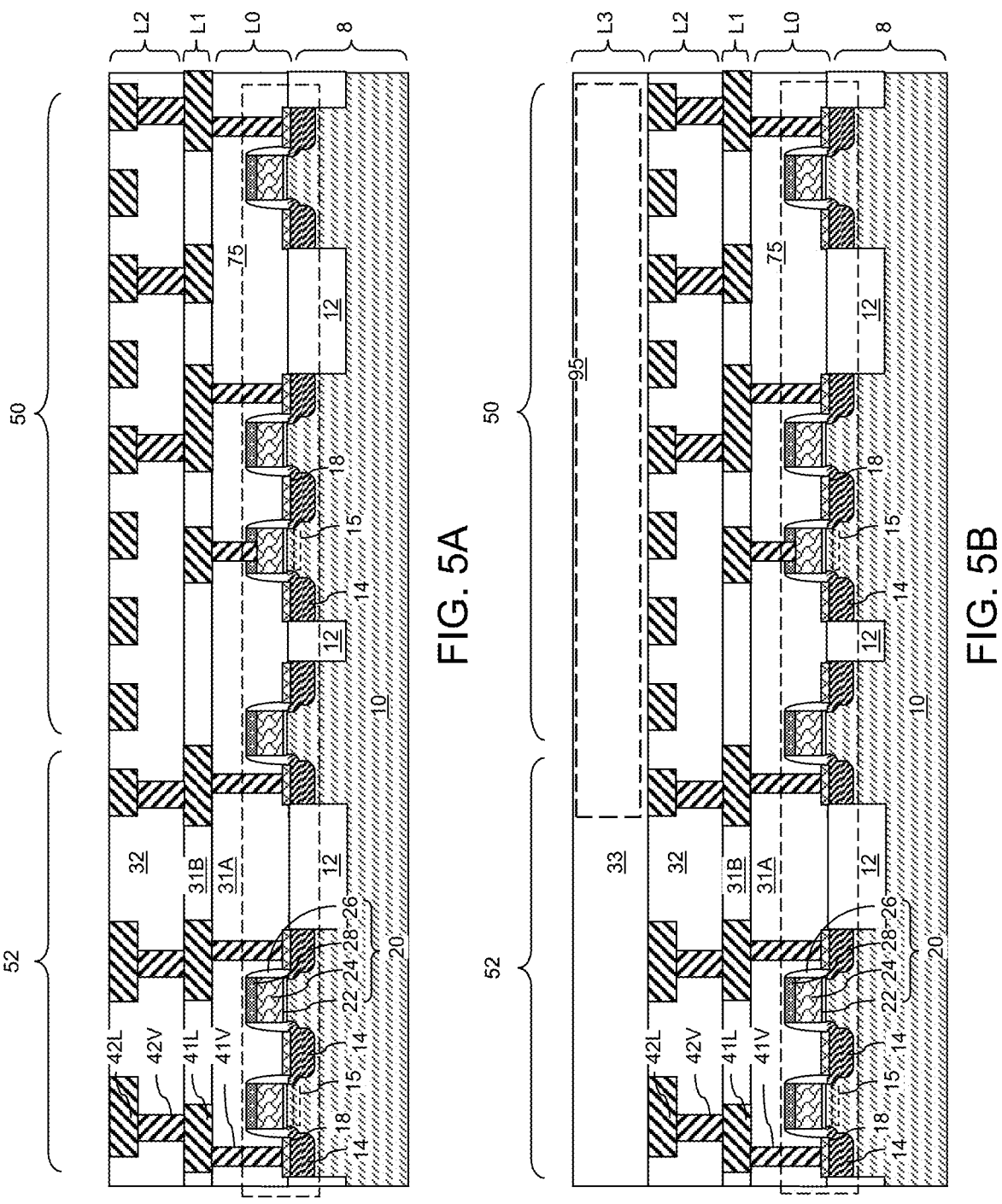
FIG. 5A is a vertical cross-sectional view of a structure after formation of complementary metal-oxide-semiconductor (CMOS) transistors, metal interconnect structures, and dielectric material layers, according to various embodiments.
FIG. 5B is a vertical cross-sectional view of a further structure during formation of a central portion and a front-side interconnect structure, according to various embodiments.

FIG. 5A is a vertical cross-sectional view of a first structure after formation of complementary metal-oxide-semiconductor (CMOS) transistors, metal interconnect structures, and dielectric material layers, according to various embodiments. The structure of 5A is an example of a structure that may be used to form the central portion 302 and the front-side interconnect structure 304, described above.

The first structure may include a substrate 8, which may be a semiconductor substrate such as a commercially available silicon substrate. The substrate 8 may include a semiconductor material layer 10 at least at an upper portion thereof. The substrate 8 may include a bulk semiconductor substrate such as a silicon substrate in which the semiconductor material layer 10 continuously extends from a top surface of the substrate 8 to a bottom surface of the substrate 8, or a semiconductor-on-insulator (SOI) layer including the semiconductor material layer 10 as a top semiconductor layer overlying a buried insulator layer (such as a silicon oxide layer). The structure may include various devices regions 50 in which devices may be subsequently formed.

The structure may also include a peripheral logic region 52 in which electrical connections between various devices and various peripheral circuits including field effect transistors may be subsequently formed. Semiconductor devices such as field effect transistors (FETs) may be formed on, and/or in, the semiconductor material layer 10 during a FEOL operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28).

Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 may constitute a gate structure 20. Additional ion implantation processes may be performed that use the gate structures 20 as self-aligned implantation masks to form deep active regions.

Such deep active regions may include deep source regions and deep drain regions. Upper portions of the deep active regions may overlap with portions of the extension implantation regions. Each combination of an extension implantation region and a deep active region may constitute a source/drain region 14 depending on electrical biasing. A semiconductor channel 15 may be formed underneath each gate stack (22, 24, 28) between a neighboring pair of source/drain regions 14. Metal-semiconductor alloy regions 18 may be formed on the top surface of each source/drain region 14.

Field effect transistors may be formed on the semiconductor material layer 10. Each field effect transistor may include a gate structure 20, a semiconductor channel 15, a pair of source/drain regions 14 (one of which functions as a source region and another of which functions as a drain region), and optional metal-semiconductor alloy regions 18. CMOS circuits 75 may be provided on the semiconductor material layer 10, which may include a periphery circuit for the array(s) of transistors, such as thin film transistors (TFTs), and PCM switches etc.

In one embodiment, the substrate 8 may include a single crystalline silicon substrate, and the CMOS circuits 75 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein and is capable of producing a doped material having electrical conductivity in a range from 1.0 S/cm to $1.0 \times 10^5$ S/cm upon suitable doping with an electrical dopant.

Various interconnect-level structures may be subsequently formed, which may form the front-side interconnect structure 304, described above. The interconnect-level structures may be referred to as lower interconnect-level structures (L0, L1, L2) and may be formed before any additional BEOL devices, such as additional memory devices. In some embodiments, one or more additional devices may be formed over one or more levels of interconnect-level metal lines. For example, the one or more additional devices may include TFTs, memory devices, or PCM switches.

The lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the source/drain regions 14 or the gate electrodes 24 and formed within the planarization dielectric layer 31A.

The first interconnect-level structure L1 may include a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 may include a second ILD layer 32 and a stack of a first via-level dielectric material layer and a second line-level dielectric material layer or a line-and-via-level dielectric material layer. The second ILD layer 32 may include second interconnect-level metal interconnect structures (42V, 42L) there within, which includes first metal via structures 42V and second metal lines 42L. Top surfaces of the second metal lines 42L may be coplanar with the top surface of the second ILD layer 32.

FIG. 5B is a vertical cross-sectional view of a further structure during formation of a one or more additional BEOL devices (e.g., phase-change material switch, a memory device, etc.), according to various embodiments. The one or more additional BEOL devices may be formed in the device region 50 over the second interconnect-level structure L2. A third ILD layer 33 may be formed during formation of one or more additional BEOL devices 95. The set of all structures formed at the level of the one or more BEOL devices 95 may be referred to as a third interconnect-level structure L3.

Figure 5C:
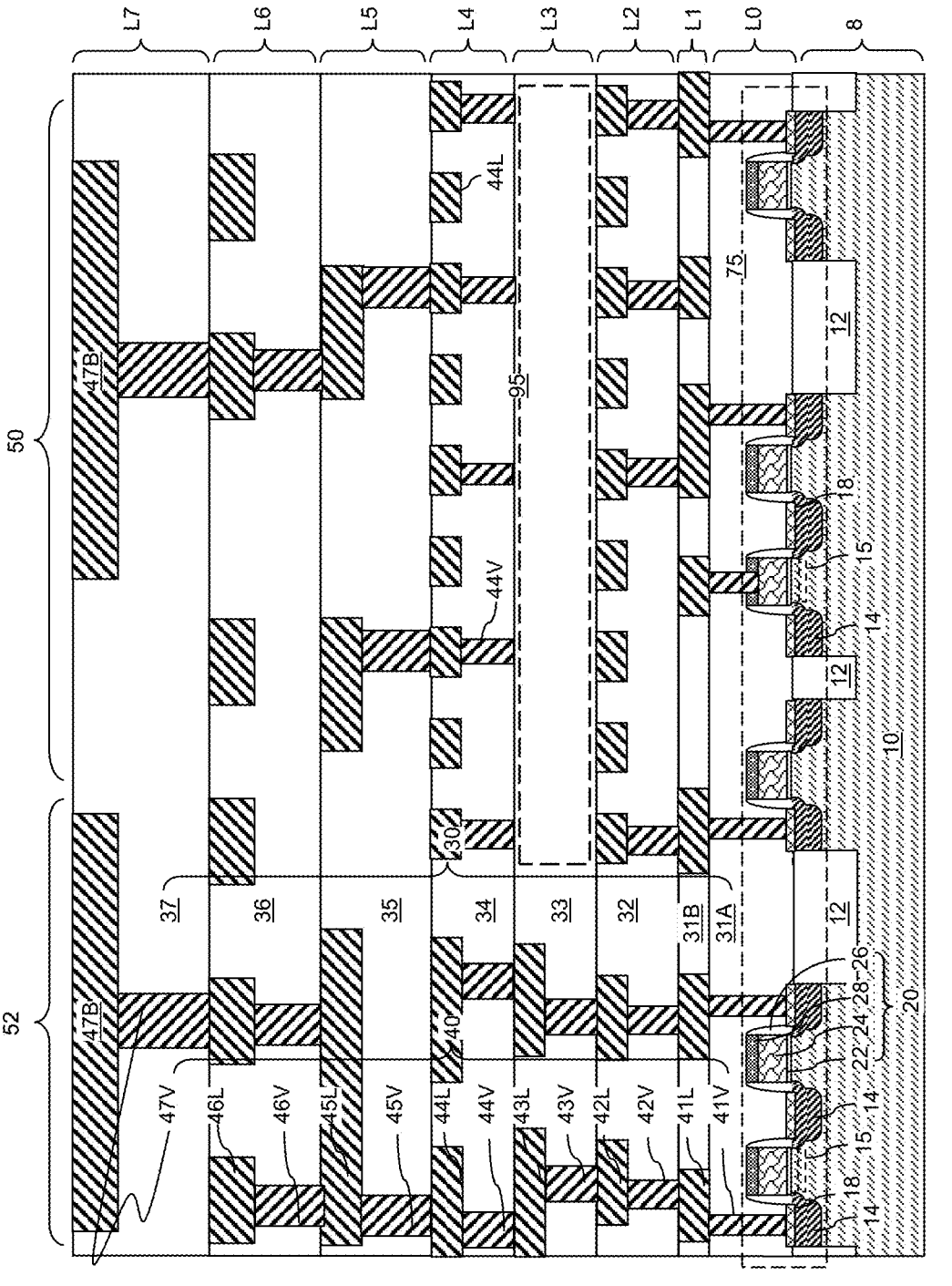
FIG. 5C is a vertical cross-sectional view of a further structure after formation of upper-level metal interconnect structures, according to various embodiments.

FIG. 5C is a vertical cross-sectional view of a further structure after formation of upper-level metal interconnect structures, according to various embodiments. Referring to FIG. 5C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7.

The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding) or may be configured for metal-to-metal bonding (such as copper-to-copper bonding), as described above with reference to FIGS. 1 and 2.

Each ILD layer may be referred to as an ILD layer 30. Each of the ILD layers 30 may include a dielectric material such as undoped silicate glass, a doped silicate glass, organosilicate glass, amorphous fluorinated carbon, porous variants thereof, or combinations thereof. Other suitable dielectric materials are within the contemplated scope of disclosure. The ILD layers 30 may be deposited using any suitable deposition process, such as chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Each of the interconnect-level metal interconnect structures may be referred to as an interconnect structure 40. Each contiguous combination of a metal via structure and an overlying metal line located within a same interconnect-level structure (L2-L7) may be formed sequentially as two distinct structures by employing two single damascene processes or may be simultaneously formed as a unitary structure employing a dual damascene process. Each of the interconnect structure 40 may include a respective metallic liner (such as a layer of TiN, TaN, WN, TiC, TaC, and WC having a thickness in a range from 2 nanometers (nm) to 20 nm) and a respective metallic fill material (such as W, Cu, Al, Co, Ru, Mo, Ta, Ti, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30 or may be incorporated into one or more of the ILD layers 30.

While various embodiments may be described in which the one or more additional BEOL devices 95 may be formed as a component of a third interconnect-level structure L3 (e.g., within the L3 interconnect-level dielectric), embodiments are expressly contemplated herein in which the one or more BEOL devices 95 may be formed as components of any other interconnect-level structure (e.g., L1-L7). Further, while this example is described using an embodiment in which a set of eight interconnect-level structures are formed, embodiments are expressly contemplated herein in which a different number of interconnect-level structures is used.

In addition, embodiments are expressly contemplated herein in which two or more additional BEOL devices 95 may be provided within multiple interconnect-level structures in the device region 50. While an embodiment is disclosed in which one or more additional BEOL devices 95 may be formed in a single interconnect-level dielectric layer (e.g., at L3), embodiments are expressly contemplated herein in which one or more additional BEOL devices 95 may be formed over two vertically adjoining interconnect-level dielectric layers, as described in greater detail below with reference to FIG. 5D.

Figure 5D:
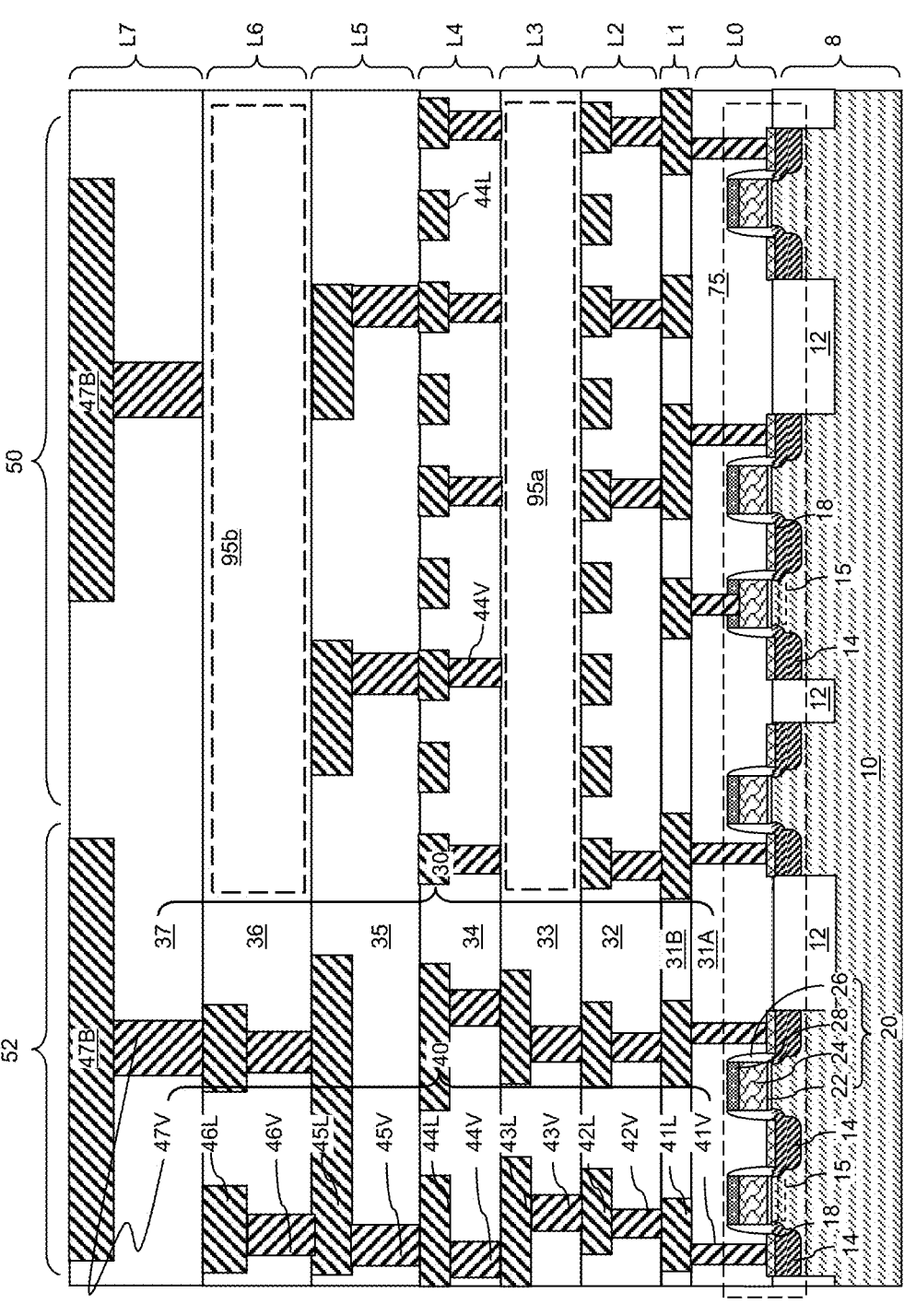
FIG. 5D is a vertical cross-sectional view of a further structure in which two additional devices have been formed within two respective vertically adjoining interconnect-level dielectric layers, according to various embodiments.

FIG. 5D is a vertical cross-sectional view of a further structure in which two additional BEOL devices (95a, 95b) have been formed over two respective vertically adjoining interconnect-level dielectric layers, according to various embodiments. In this example, a first one or more additional BEOL devices 95a may be formed in the device region 50 over the second interconnect-level structure L2 (e.g., within the L3 interconnect-level dielectric). The structure of FIG. 5D further includes one or more additional BEOL devices 95b formed in the device region 50 over the fifth interconnect-level structure L5 (e.g., within the L6 interconnect-level dielectric).

FIGS. 6A to 6F are vertical cross-sectional views of intermediate structures (600a, 600b, 600c, 600d, 600e, 600f) that may be used in the formation of a double-sided semiconductor die, according to various embodiments. The intermediate structure 600a may include a central portion 302 having a plurality of transistor structures 601 formed on a semiconductor substrate 402 in an FEOL process, as described above with reference to FIGS. 5A to 5D. In this example embodiment, the transistor structures 601 are illustrate as FinFET transistors, however, other types of transistor structures may be formed in the central portion 302. For example, in other embodiments, the central portion 302 may include CMOS circuits 75, as described above with reference to FIG. 5A. Each of the transistor structures 601 may be separated from one another by a plurality of shallow trench isolation structures 12. The intermediate structure 600a may further include a planarization dielectric layer 31A including a planarizable dielectric material such as silicon oxide.

Figures 6A, 6B, 6C, 6D:
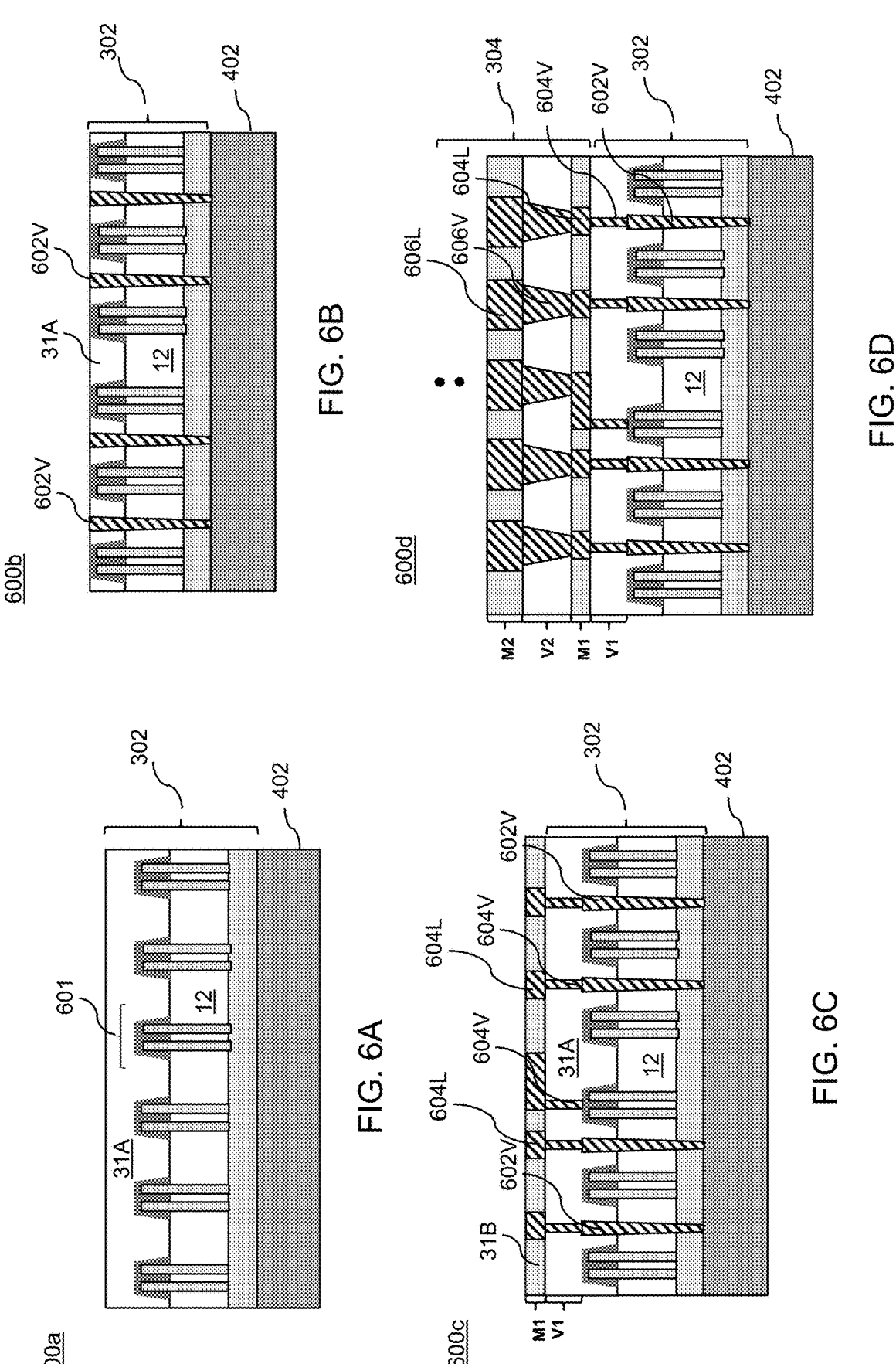
FIG. 6A is a vertical cross-sectional view of an intermediate structure that may be used in the formation of a double-sided semiconductor die, according to various embodiments.
FIG. 6B is a vertical cross-sectional view of a further intermediate structure that may be used in the formation of a double-sided semiconductor die, according to various embodiments.
FIG. 6C is a vertical cross-sectional view of a further intermediate structure that may be used in the formation of a double-sided semiconductor die, according to various embodiments.
FIG. 6D is a vertical cross-sectional view of a further intermediate structure that may be used in the formation of a double-sided semiconductor die, according to various embodiments.

The intermediate structure 600b of FIG. 6B may be formed from the intermediate structure 600a of FIG. 6A by removing a top portion of the planarization dielectric layer 31A above top surfaces of the transistor structures 601 and by forming deep vias 602V through the central portion 302. As shown, the deep vias 602V may be formed in the shallow trench isolation structures 12 in regions between the transistor structures 601. The deep vias 602V may have a width that is in a range from 10 nm to 20 nm. As shown in FIG. 6B, the deep vias may be formed so as not to penetrate to a back side of the semiconductor substrate 402.

The intermediate structure 600c may be formed by forming an additional layer of the planarization dielectric layer 31A over the deep vias 602V. First vias 604V may then be formed in the planarization dielectric layer 31A followed by deposition of a first interlayer dielectric layer 31B in which first metal lines 604L may be formed. Thus, as shown in FIG. 6C, a first via layer V1 and a first metal layer M1 may be formed. As indicated in FIG. 6C, the first via layer V1 may represent a top structure of the central portion 302 and the first metal layer M1 may be a first layer in a front-side interconnect structure 304 to be formed, as shown in FIG. 6D. As further shown in FIG. 6D, a second via layer V2 and a second metal layer M2 may be formed over the central portion 302. The second via layer V2 may include second vias 606V and the second metal layer M2 may include second metal lines 606L. A plurality of additional metal lines and vias may be formed over the second via layer V2 and the second metal layer. For example, in some embodiments, the resulting front-side interconnect structure 304 may include 10 to 20 interconnect levels formed in 10 to 20 respective front-side dielectric layers.

Figure 6F:
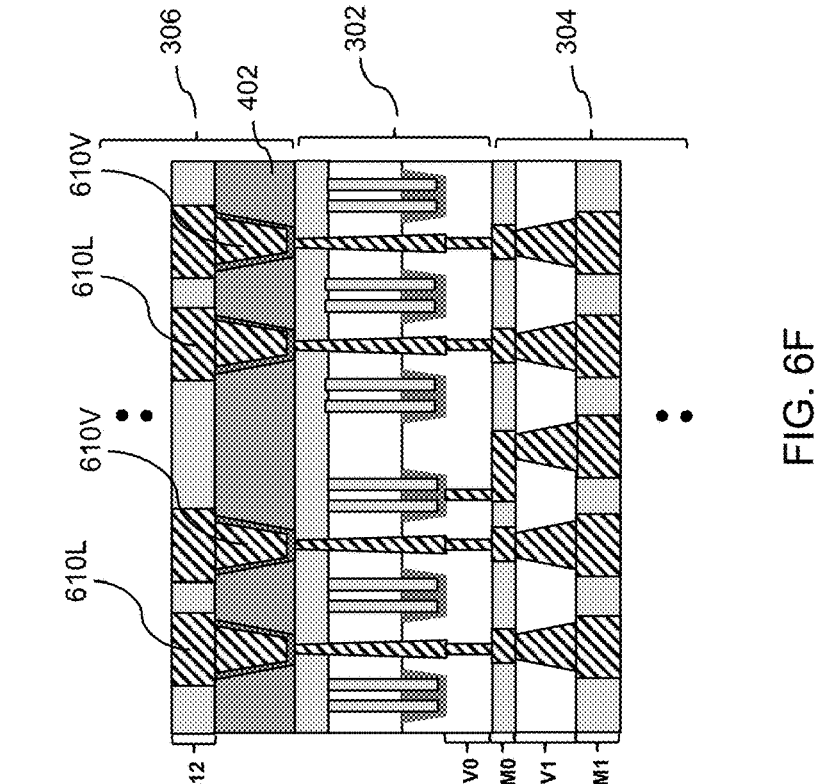
FIG. 6F is a vertical cross-sectional view of a further intermediate structure that may be used in the formation of a double-sided semiconductor die, according to various embodiments.
Figure 6E:
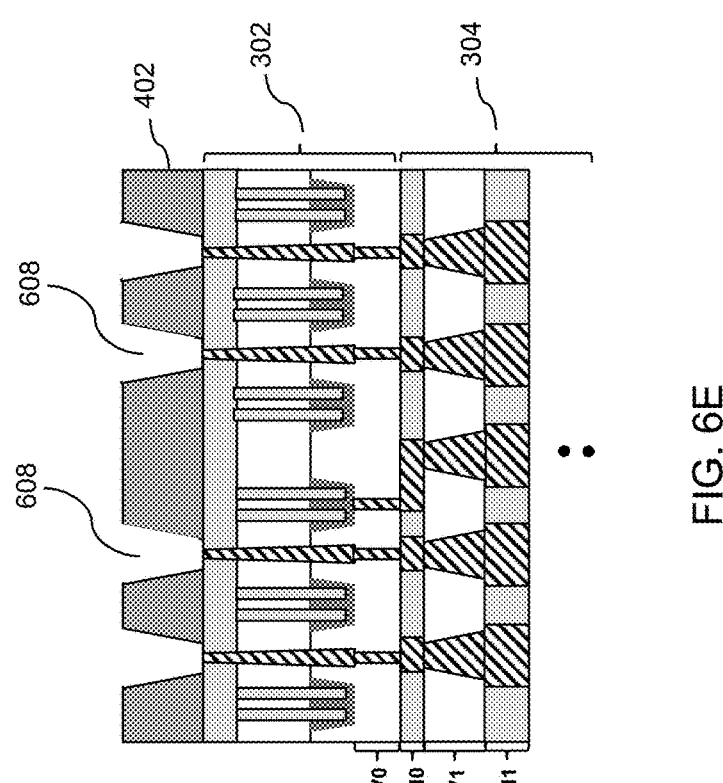
FIG. 6E is a vertical cross-sectional view of a further intermediate structure that may be used in the formation of a double-sided semiconductor die, according to various embodiments.

FIG. 6E is a vertical cross-sectional view of a further intermediate structure 600e that may be used to form a double-sided semiconductor die, according to various embodiments. In this regard, after formation of a plurality of additional metal lines and vias in the front-side interconnect structure 304, the structure may be inverted (e.g., see FIG. 6E) such that an additional BEOL process may be performed to generate the back-side interconnect structure 306 (e.g., see FIG. 6F). In this regard, a back-side portion of the substrate 402 may be removed by a planarization process, and a plurality of via cavities 608 may be formed in a remaining portion of the substrate 402, as shown in FIG. 6E. As shown in FIG. 6F, first back-side vias 610V may then be formed in the via cavities 608 of FIG. 6E. A first back-side metallization layer 612 including first back-side metal lines 610L may be formed.

As shown in FIG. 6F, the back-side portion of the substrate 402 including the first back-side vias 610V along with the first back-side metallization layer 612 may form first components of the back-side interconnect structure 306. A plurality of additional metal lines and vias may then be formed over the first back-side vias 610V along with the first back-side metallization layer 612 to thereby form the back-side interconnect structure 306. For example, in some embodiments, the resulting back-side interconnect structure 306 may include 5 to 10 interconnect levels formed in 5 to 10 respective back-side dielectric layers. As described above with reference to FIG. 4H, once the back-side interconnect structure 306 has been completed, a plurality of double-sided semiconductor dies 102 may be singulated from a wafer on which the central portion 302, the front-sided interconnect structure 304, and the back-side interconnect structure 306 has been formed.

Figures 7A, 7B:
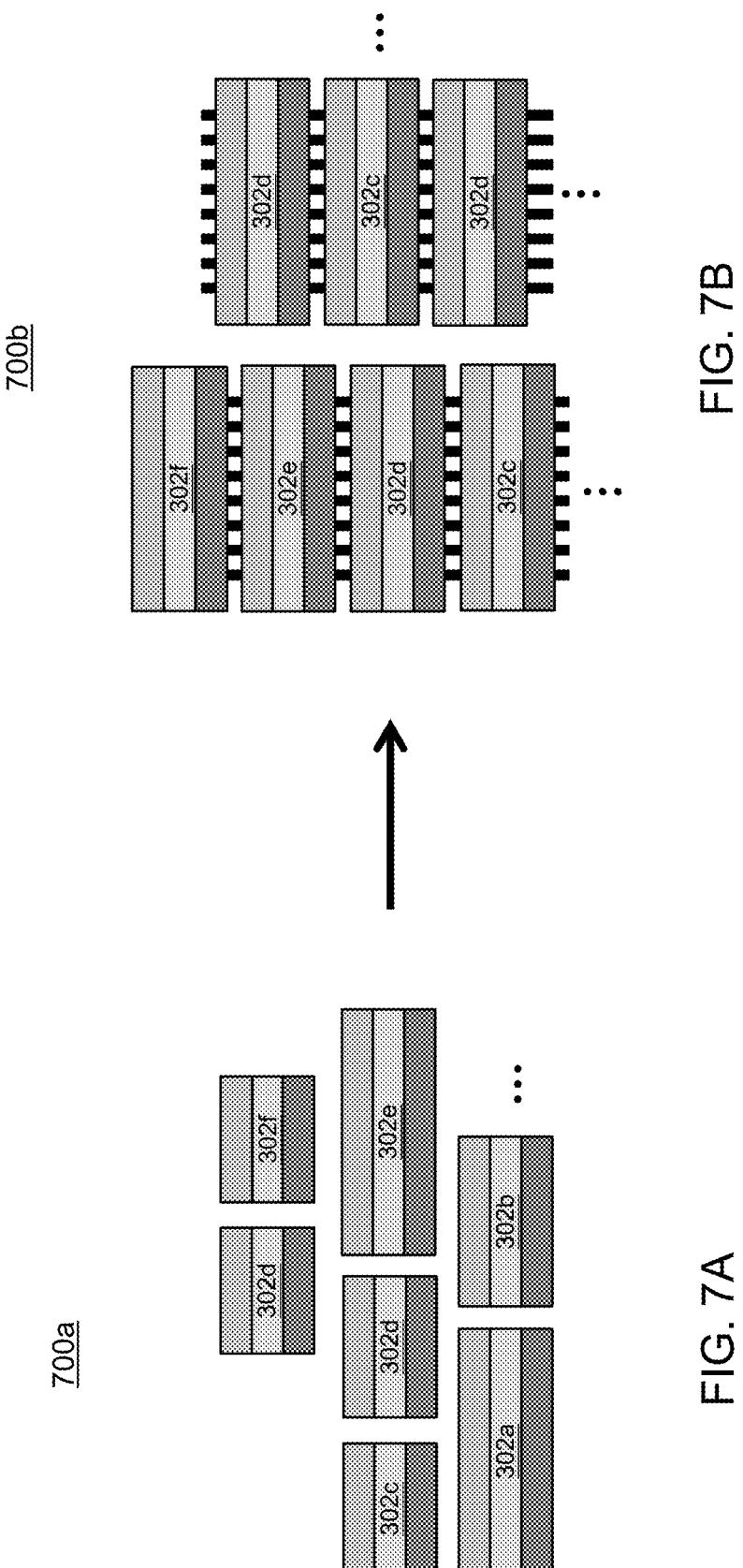
FIG. 7A is a vertical cross-sectional view of a plurality of double-sided semiconductor dies that may be used to form one or more semiconductor die stacks, according to various embodiments.
FIG. 7B is a vertical cross-sectional view of a plurality of double-sided semiconductor dies electrically coupled to form two semiconductor die stacks, according to various embodiments.
Figure 8D:
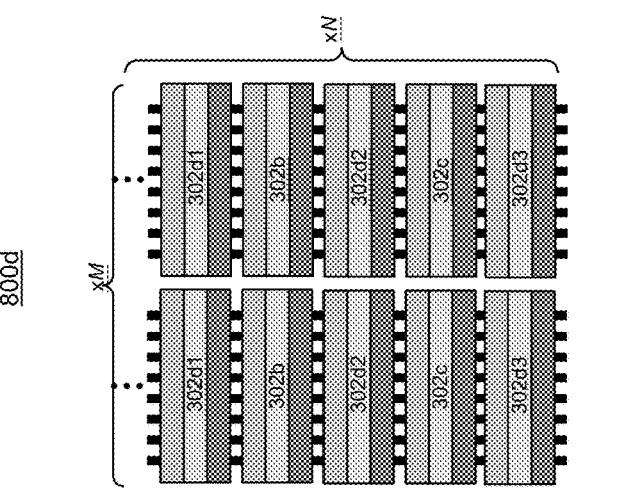
FIG. 8D is a vertical cross-sectional view of a plurality of double-sided semiconductor dies electrically coupled to form two semiconductor die stacks, according to various embodiments.
Figure 8C:
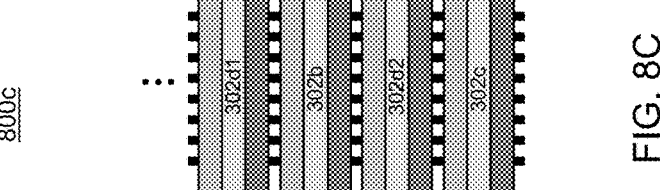
FIG. 8C is a vertical cross-sectional view of a plurality of double-sided semiconductor dies electrically coupled to one another to form a further semiconductor die stack, according to various embodiments.
Figure 8B:
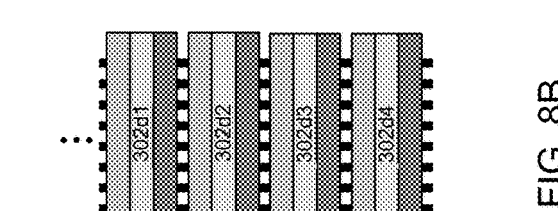
FIG. 8B is a vertical cross-sectional view of a plurality of double-sided semiconductor dies electrically coupled to one another to form a further semiconductor die stack, according to various embodiments.
Figure 8A:
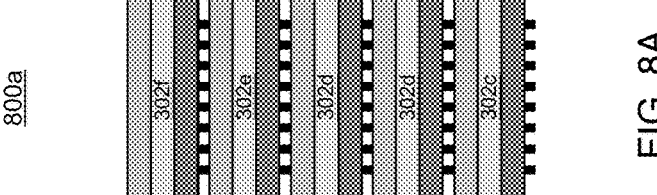
FIG. 8A is a vertical cross-sectional view of a plurality of double-sided semiconductor dies electrically coupled to one another to form a semiconductor die stack, according to various embodiments.

FIG. 7A is a vertical cross-sectional view of a plurality of double-sided semiconductor dies 700a that may be used to form one or more semiconductor die stacks, and FIG. 7B is a vertical cross-sectional view of a plurality of double-sided semiconductor dies electrically coupled to form two semiconductor die stacks 700b, according to various embodiments. The various double-sided semiconductor dies 700a may provide various functionalities. For example, a first double-sided semiconductor die may include a central portion 302a that may provide BCD power CMOS circuits. A further double-sided semiconductor die may include a central portion 302b may be configured as a heat dissipation structure (e.g., a heat pipe), without any electrical circuits. A further double-sided semiconductor die may include a central portion 302c that may include application program (AP) logic circuits. A further double-sided semiconductor die may include a first central portion 302d that may include memory circuits. A further double-sided semiconductor die may include a first central portion 302e that may include image processing circuits, and a further double-sided semiconductor die may include a first central portion 302f that may include pixel input/output processing circuits for an image sensor. Various other double-sided semiconductor dies may provide additional functionalities in other embodiments.

As shown in FIG. 7B, a first die stack (left side) may include (from bottom to top) a double-sided semiconductor die including a central portion 302c including AP logic circuits, a double-sided semiconductor die including a central portion 302d including memory circuits, a double-sided semiconductor die including a central portion 302e including image processing circuits, and a double-sided semiconductor die including a central portion 302f including pixel IO circuits. Similarly, as also shown in FIG. 7B, a second die stack (right side) may include (from bottom to top) a double-sided semiconductor die including a central portion 302d including memory circuits, a double-sided semiconductor die including a central portion 302c including AP logic circuits, and a further double-sided semiconductor die including a central portion 302d including additional memory circuits.

FIGS. 8A to 8D are vertical cross-sectional views of die stacks (800a, 800b, 800c, 800d) each including a plurality of double-sided semiconductor dies, according to various embodiments. For example, the first die stack 800a may include (from bottom to top) dies including AP logic circuits 302c, memory circuits 302d, further memory circuits 302d, image processing circuits 302e, and pixel IO circuits 302f. The second die stack 800b may include (from bottom to top) dies including fourth level memory circuits 302d4, third level memory circuits 302d3, second level memory circuits 302d2, and first level memory circuits 302d1. The third die stack 800c may include (from bottom to top) dies including AP logic circuits 302c, second level memory circuits 802d2, a heat dissipation structure 302b (e.g., a heat pipe), and first level memory circuits 302d1. The fourth die stack 800d includes a plurality of die stacks that may be repeated horizontally xM times and vertically xN times. In this example embodiment, each of the die stacks may include (from bottom to top) dies including third level memory circuits 302d3, AP logic circuits 302c, second level memory circuits 302d2, a heat dissipation structure 302b, and first level memory circuits 302d1.

FIGS. 9A to 9E are vertical cross-sectional views of die stacks (900a, 900b, 900c, 900d, 900e) each including a plurality of double-sided semiconductor dies, according to various embodiments. The first die stack 900a may include a plurality of semiconductor dies formed on an interposer 902 or package substrate. The structure may include (from bottom to top) dies including third level memory circuits 302d3, AP logic circuit 302c, a first power distribution circuit (i.e., a power rail) 302g, a heat dissipation structure 302b, memory circuits 302d, and a second power distribution circuit 302g. As shown, the first die stack 900a may further include power TSV structures 904, and each of the central portions 302 may include micro-TSV structures 906.

Figures 9A, 9B, 9C, 9D, 9E:
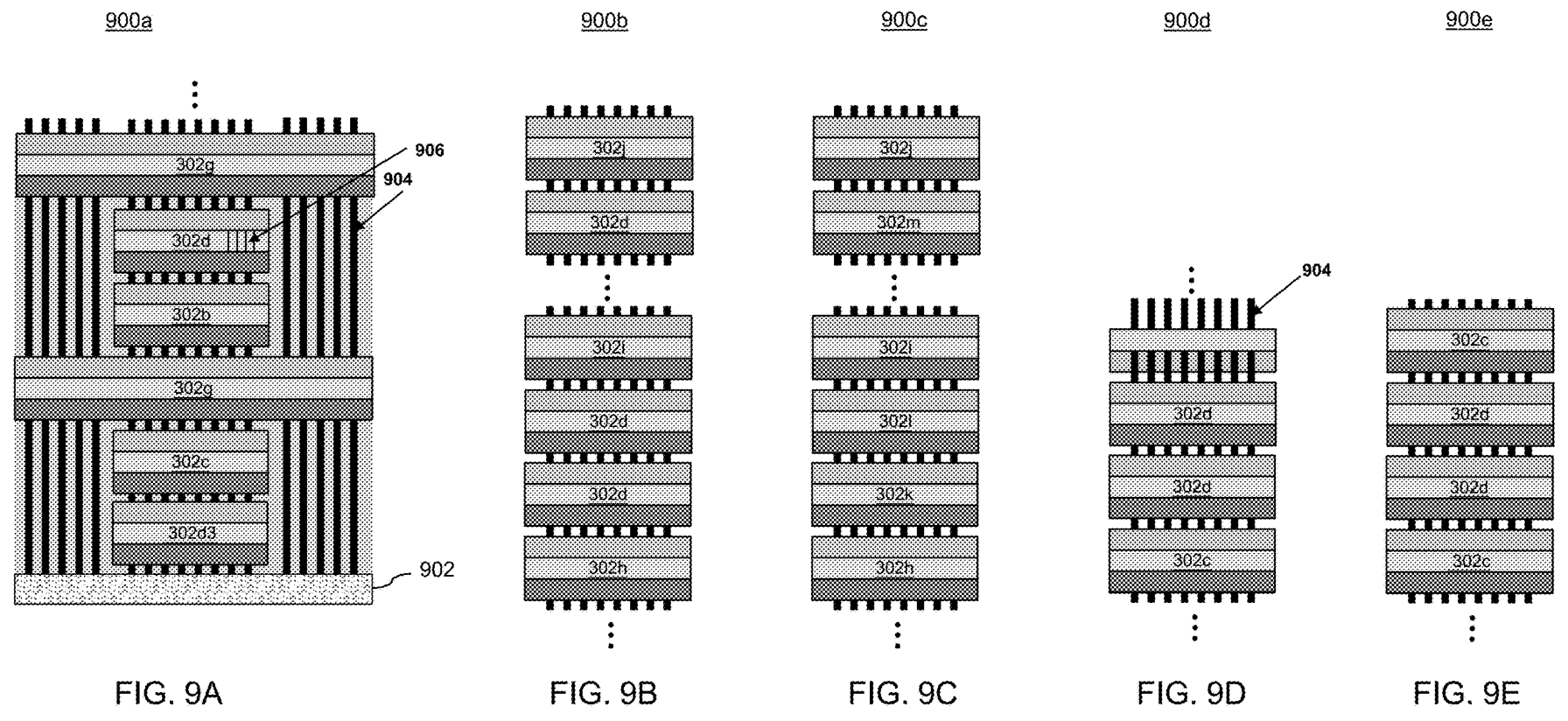

Additional functionality may be provided by the double-sided semiconductor dies in the die stacks 900b, 900c, 900d, and 900e. For example, the die stack 900b may include (from bottom to top) dies including CPU circuits 302h, memory circuits 302d, further memory circuits 302d, GPU circuits 302i, further memory circuits 302d, and AI processing circuits 302j. Similarly, die stack 900c may include (from bottom to top) dies including CPU circuits 302h, level-2 cache 302k circuits, level-3 cache 302l circuits, GPU circuits 302i, main memory circuits 302m, and AI processing circuits 302j. As shown, die stacks 900d and 900e may include (from bottom to top) dies including AP logic circuits 302c, first memory circuits 302d, and second memory circuits 302d. As shown, for example, in die stack 900d, any or all of the double-sided dies may include power TSV structures 904 in addition to micro-TSV structures 906 (see FIG. 9A). Each of the die stacks (900a, 900b, 900c, 900d, 900e) may also include a variety of other semiconductor dies (e.g., die stack 900e further includes additional AP logic circuits 302c as shown in FIG. 9E).

Figure 10:
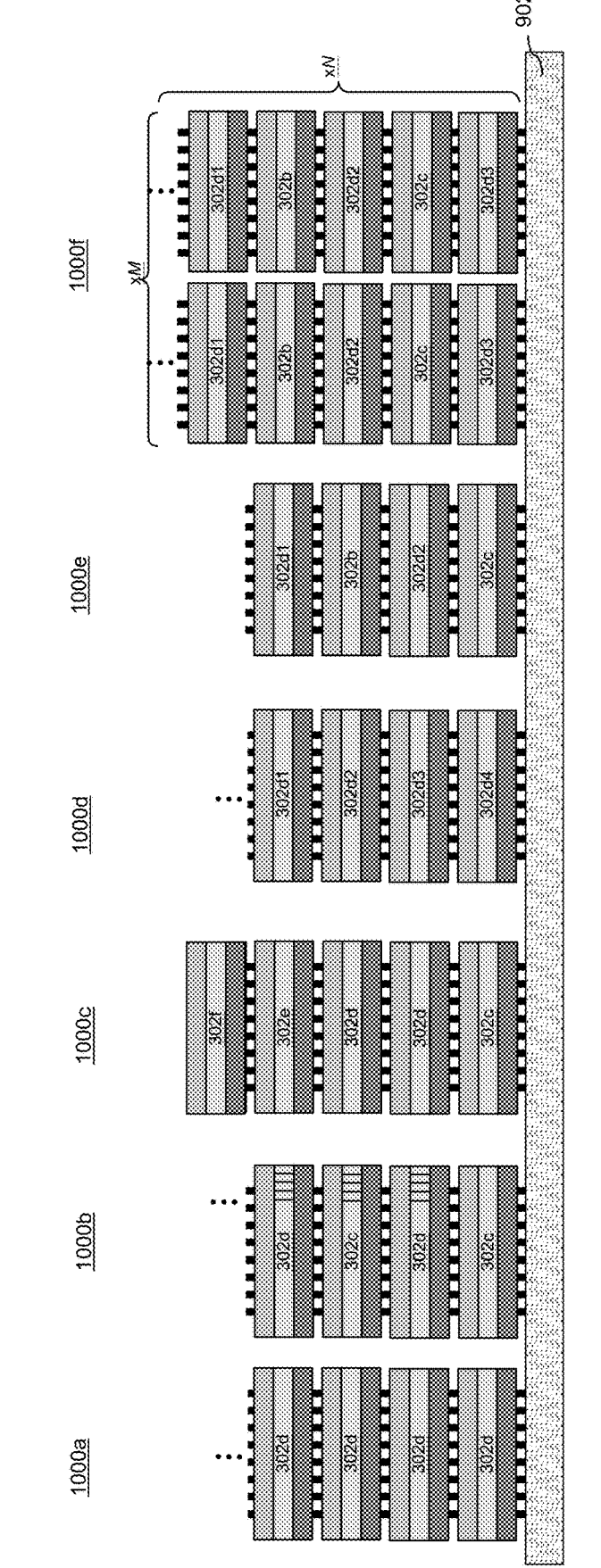
FIG. 10 is a vertical cross-sectional view of a semiconductor package structure including an interposer and a plurality of semiconductor die stacks, according to various embodiments.

FIG. 10 is a vertical cross-sectional view of a semiconductor package structure 1000 including an interposer 902 and a plurality of semiconductor die stacks (1000a, 1000b, 1000c, 1000d, 1000e, 1000f), according to various embodiments. As shown, the various semiconductor die stacks (1000a, 1000b, 1000c, 1000d, 1000e, 1000f) may be formed by combining a variety of different types of double-sided semiconductor dies in various ways, as described above with reference to FIGS. 7A to 9E. For example, the semiconductor package structure 1000 may include dies including heat dissipation structures 302b, AP logic circuits 302c, memory circuits 302d, first level memory circuits 302d1, second level memory circuits 302d2, third level memory circuits 302d3, fourth level memory circuits 302d4, image processing circuits 302e, and pixel IO circuits 302f. These circuit functionalities, described above with reference to FIG. 10, are provided merely as examples and various other types of double-sided semiconductor dies, providing other functionalities, may also be included in other semiconductor package structure in respective other embodiments.

FIG. 11 is a flowchart illustration various operations of a method 1100 of forming a semiconductor device (300a, 800a-1000), according to various embodiments. In operation 1102, the method 1100 may include forming a first semiconductor die 102 including a first front-side interconnect structure 304a and a first back-side interconnect structure 306a. In operation 1104, the method 1100 may include forming a second semiconductor die 104 including a second front-side interconnect structure 304b and a second back-side interconnect structure 306b. In operation 1106, the method 1100 may include electrically connecting the first back-side interconnect structure 306a to the second front-side interconnect structure 304b. According to the method 1100, operations 1102 and 1104 of forming each of the first semiconductor die 102 and the second semiconductor die 104 may include additional operations. For example, each of operations 1102 and 1104 may further include forming a central portion 302 including electrical circuit elements (75, 601) in or on a semiconductor substrate 402 in a front-end-of-line process followed by performing a first back-end-of-line process to form a front-side interconnect structure 304 in a first dielectric layer 30. The method 1100 may further include performing a second back-end-of-line process to form a back-side interconnect structure 306 in a second dielectric layer 30. The method 1100 may be performed such that the central portion 302 is disposed between the front-side interconnect structure 304 and the back-side interconnect structure 306.

The method 1100 may further include forming a plurality of vias (602V, 604V, 606V) in the central portion 302; and electrically connecting the front-side interconnect structure 304 and the back-side interconnect structure 306 to the plurality of vias (602V, 604V, 606V) such that the front-side interconnect structure 304 and the back-side interconnect structure 306 are electrically connected to one another by the plurality of vias (602V, 604V, 606V).

Referring to all drawings and according to various embodiments of the present disclosure, a semiconductor device (300a, 800a, 900a, 1000) is provided. The semiconductor device (300a, 800a, 900a, 1000) may include a first semiconductor die 102 including a first front-side interconnect structure 304a and a first back-side interconnect structure 306a, and a second semiconductor die 104 including a second front-side interconnect structure 304b and a second back-side interconnect structure 306b, such that the first back-side interconnect structure 306a is electrically connected to the second front-side interconnect structure 304b. The first semiconductor die 102 may include a first central portion 302a disposed between the first front-side interconnect structure 304a and the first back-side interconnect structure 306a, the second semiconductor die 104 may include a second central portion 302b disposed between the second front-side interconnect structure 304b and the second back-side interconnect structure 306b. Further, each of the first central portion 302a and the second central portion 302b may include electrical circuit elements (75, 601) formed in or on a semiconductor substrate 402.

In various embodiments, each of the first front-side interconnect structure 304a, the first back-side interconnect structure 306a, the second front-side interconnect structure 304b, and the second back-side interconnect structure 306b, may include electrical interconnects 40 formed within a dielectric layer 30. The first central portion 302a may include first vias (602V, 604V, 606V) that electrically connect the first front-side interconnect structure 304a to the first back-side interconnect structure 306a. Similarly, the second central portion 302b may include second vias (602V, 604V, 606V) that electrically connect the second front-side interconnect structure 304b to the second back-side interconnect structure 306b. The first vias (602V, 604V, 606V) may formed within first shallow trench isolation structures 12 between first transistor structures 601 formed in the first central portion 302a; and the second vias (602V, 604V, 606V) are formed within second shallow trench isolation structures between second transistor structures 601 formed in the second central portion 302b (see FIG. 6B). Each of the first vias (602V, 604V, 606V) and the second vias (602V, 604V, 606V) include a width that is in a range from 10 nm to 20 nm.

In various embodiments, the first back-side interconnect structure 306a may be electrically connected to the second front-side interconnect structure 304b with hybrid bonding structures 106a in which first electrical bonding structures 180 of the first back-side interconnect structure 306a are bonded to second electrical bonding structures 280 of the second front-side interconnect structure 304b with direct metal-to-metal bonds. The first back-side interconnect structure 306a may be formed in a first dielectric layer 160 and the second front-side interconnect structure 304b may be formed in a second dielectric layer 260, and the hybrid bonding structures 106a may further include direct dielectric-to-dielectric bonds between the first dielectric layer 160 and the second dielectric layer 260. The first electrical bonding structures 180 and the second electrical bonding structures 280 may be configured as a periodic array having a pitch that is in a range from 0.1 microns to 10 microns.

In various embodiments, each of the first front-side interconnect structure 304a and the second front-side interconnect structure 304b may include 10 to 20 interconnect levels formed in 10 to 20 respective front-side dielectric layers, and each of the first back-side interconnect structure 306a and the second back-side interconnect structure 306b may include 5 to 10 interconnect levels formed in 5 to 10 respective back-side dielectric layers.

The semiconductor device (300a, 800a-1000) may further include a third semiconductor die 105 including a third front-side interconnect structure 304c and a third back-side interconnect structure 306c. Further, the second back-side interconnect structure 306b of the second semiconductor die 104 may be electrically connected to the third front-side interconnect structure 304c of the third semiconductor die 105. In various embodiments, the first semiconductor die 102 may include first logic circuits 302c, the second semiconductor die 104 includes first memory circuits 302d, and the third semiconductor die 105 includes one of second logic circuits 302c, second memory circuits 302d, image processing circuits 302e, power delivery circuits 302a, analog circuits, passive device components, and thermal dispersion components 302b. In certain embodiments, at least one of the first semiconductor die 102, the second semiconductor die 104, and the third semiconductor die 105 corresponds to a different technology node than another of the first semiconductor die 102, the second semiconductor die 104, and the third semiconductor die 105.

According to various embodiments of the present disclosure, a semiconductor package structure (900a, 1000) is provided. The semiconductor package structure (900a, 1000) may include an interposer 902, a first die stack 1000a electrically connected to the interposer 902, and a second die stack 1000b electrically connected to the interposer 902. The first die stack 1000a and the second die stack 1000b each include two or more semiconductor dies (102, 104, 105) stacked such that a back-side interconnect structure 306 of one semiconductor die is electrically connected to a front-side interconnect structure 304 of another semiconductor die.

In various embodiments, the first die stack 1000a may further include a first semiconductor die 102 including a first front-side interconnect structure 304a and a first back-side interconnect structure 306a, and a second semiconductor die 104 including a second front-side interconnect structure 304b and a second back-side interconnect structure 306b, such that the first back-side interconnect structure 306a is electrically connected to the second front-side interconnect structure 304b. The second die stack 1000b may further include a third semiconductor die 105 including a third front-side interconnect structure 304c and a third back-side interconnect structure 306c, and a fourth semiconductor die (not shown) including a fourth front-side interconnect structure (not shown) and a fourth back-side interconnect structure (not shown), wherein the third back-side interconnect structure 306c is electrically connected to the fourth front-side interconnect structure (not shown).

Each of the two or more semiconductor dies (102, 104, 105) may include a central portion 302 disposed between a front-side interconnect structure 304 and a back-side interconnect structure 306. Further, the central portion 302 may include electrical circuit elements (75, 601) formed in or on a semiconductor substrate 402. Each of the front-side interconnect structure 304 and the back-side interconnect structure 306 may include electrical interconnects 40 formed within a dielectric layer 30, and the central portion 302 may further includes vias (602V, 604V, 606V) that electrically connect the front-side interconnect structure 304 to the back-side interconnect structure 306.

Various embodiments disclosed herein may provide advantages over existing semiconductor packages by using double-sided semiconductor dies that may each include a central portion 302 having electrical circuits formed in an FEOL process disposed between a front-side interconnect structure 304, formed in a BEOL process, and a back-side interconnect structure 306, also formed in a BEOL process. The FEOL circuit components in each double-sided die may be configured to provide respective functionality (e.g., logic, memory, image processing, power delivery, analog circuits, etc.). Since different functionality may be provided by different semiconductor dies, the performance of a first semiconductor die 102 may be optimized without regard to how a second semiconductor die 104 may be optimized. Further, a standard layout of electrical bonding structures within front-side interconnect structures 304 and back-side interconnect structures 306 of different semiconductor dies (102, 104) may allow a wide variety of different types of semiconductor dies to be electrically connected to one another to form a chip assembly structure.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A semiconductor package structure, comprising:
an interposer;
a first semiconductor die stack electrically connected to the interposer and comprising:
a first semiconductor die comprising a first front-side interconnect structure and a first back-side interconnect structure, and
a second semiconductor die comprising a second front-side interconnect structure and a second back-side interconnect structure, wherein the first back-side interconnect structure is electrically connected to the second front-side interconnect structure; and a second semiconductor die stack electrically connected to the interposer,
wherein the first semiconductor die is a first singulated semiconductor die including a first central portion disposed between first front-side interconnect structure and the second back-side interconnect structure; and
wherein the first central portion comprises:
first field effect transistors laterally spaced by first shallow trench isolation structures,
a first planarization dielectric layer overlying or underlying the first shallow trench isolation structures and laterally surrounding the first field effect transistors, and
first conductive vias which are located outside of, and laterally spaced from, the first field effect transistors, vertically extend through the first shallow trench isolation structures and the first planarization dielectric layer, contact a respective front-side electrical interconnect in the first front-side interconnect structure in a horizontal plane containing a planar surface of the planarization dielectric layer, and contacts a respective back-side electrical interconnect in the first back-side interconnect structure.

2. The semiconductor package structure of claim 1, wherein:
the first semiconductor die comprises a first central portion disposed between the first front-side interconnect structure and the first back-side interconnect structure;
the second semiconductor die comprises a second central portion disposed between the second front-side interconnect structure and the second back-side interconnect structure; and
each of the first central portion and the second central portion comprises electrical circuit elements formed in or on a semiconductor substrate.

3. The semiconductor package structure of claim 1, wherein each of the first front-side interconnect structure, the first back-side interconnect structure, the second front-side interconnect structure, and the second back-side interconnect structure comprises electrical interconnects formed within a dielectric layer.

4. The semiconductor package structure of claim 2, wherein:
the first central portion comprises first vias that electrically connect the first front-side interconnect structure to the first back-side interconnect structure; and
the second central portion comprises second vias that electrically connect the second front-side interconnect structure to the second back-side interconnect structure.

5. The semiconductor package structure of claim 4, wherein:
the first vias are formed within first shallow trench isolation structures between first transistor structures formed in the first central portion; and
the second vias are formed within second shallow trench isolation structures between second transistor structures formed in the second central portion.

6. The semiconductor package structure of claim 5, wherein each of the first vias and the second vias comprise a width that is in a range from 10 nm to 20 nm.

7. The semiconductor package structure of claim 1, wherein the first back-side interconnect structure is electrically connected to the second front-side interconnect structure with hybrid bonding structures in which first electrical bonding structures of the first back-side interconnect structure are bonded to second electrical bonding structures of the second front-side interconnect structure with direct metal-to-metal bonds.

8. The semiconductor package structure of claim 7, wherein the first back-side interconnect structure is formed in a first dielectric layer and the second front-side interconnect structure is formed in a second dielectric layer, and wherein the hybrid bonding structures further comprise direct dielectric-to-dielectric bonds between the first dielectric layer and the second dielectric layer.

9. The semiconductor package structure of claim 7, wherein the first electrical bonding structures and the second electrical bonding structures are configured as a periodic array having a pitch that is in a range from 0.1 microns to 10 microns.

10. The semiconductor package structure of claim 1, wherein each of the first front-side interconnect structure and the second front-side interconnect structure comprises 10 to 20 interconnect levels formed in 10 to 20 respective front-side dielectric layers, and wherein each of the first back-side interconnect structure and the second back-side interconnect structure comprises 5 to 10 interconnect levels formed in 5 to 10 respective back-side dielectric layers.

11. The semiconductor package structure of claim 1, further comprising:
a third semiconductor die comprising a third front-side interconnect structure and a third back-side interconnect structure,
wherein the second back-side interconnect structure of the second semiconductor die is electrically connected to the third front-side interconnect structure of the third semiconductor die.

12. The semiconductor package structure of claim 11, wherein:
the first semiconductor die comprises first logic circuits;
the second semiconductor die comprises first memory circuits; and
the third semiconductor die comprises one of second logic circuits, second memory circuits, image processing circuits, power delivery circuits, analog circuits, passive device components, and thermal dispersion components.

13. The semiconductor package structure of claim 12, wherein at least one of the first semiconductor die, the second semiconductor die, and the third semiconductor die corresponds to a different technology node than another of the first semiconductor die, the second semiconductor die, and the third semiconductor die.

14. A semiconductor package structure, comprising:
an interposer;
a first die stack electrically connected to the interposer; and
a second die stack electrically connected to the interposer,
wherein the first die stack and the second die stack each comprise two or more semiconductor dies stacked such that a back-side interconnect structure of one semiconductor die is electrically connected to a front-side interconnect structure of another semiconductor die,
wherein the semiconductor dies in the first die stack and the second die stack are singulated semiconductor dies including a respective central portion disposed between a respective front-side interconnect structure and a respective back-side interconnect structure; and
wherein the respective central portion comprises:
respective field effect transistors laterally spaced by respective shallow trench isolation structures, a respective planarization dielectric layer overlying or underlying the respective shallow trench isolation structures and laterally surrounding the respective field effect transistors, and
respective conductive vias which are located outside of, and laterally spaced from, the respective field effect transistors, vertically extend through the respective shallow trench isolation structures and the respective planarization dielectric layer, contact a respective front-side electrical interconnect in the respective front-side interconnect structure in a horizontal plane containing a planar surface of the planarization dielectric layer, and contacts a respective back-side electrical interconnect in the respective back-side interconnect structure.

15. The semiconductor package structure of claim 14, wherein:
the first die stack further comprises:
a first semiconductor die comprising a first front-side interconnect structure and a first back-side interconnect structure; and
a second semiconductor die comprising a second front-side interconnect structure and a second back-side interconnect structure,
wherein the first back-side interconnect structure is electrically connected to the second front-side interconnect structure, and
the second die stack further comprises:
a third semiconductor die comprising a third front-side interconnect structure and a third back-side interconnect structure; and
a fourth semiconductor die comprising a fourth front-side interconnect structure and a fourth back-side interconnect structure,
wherein the third back-side interconnect structure is electrically connected to the fourth front-side interconnect structure.

16. The semiconductor package structure of claim 14, wherein each of the two or more semiconductor dies comprise a central portion disposed between a front-side interconnect structure and a back-side interconnect structure, and
wherein the central portion comprises electrical circuit elements formed in or on a semiconductor substrate.

17. The semiconductor package structure of claim 16, wherein each of the front-side interconnect structure and the back-side interconnect structure comprise electrical interconnects formed within a dielectric layer, and
wherein the central portion further comprises vias that electrically connect the front-side interconnect structure to the back-side interconnect structure.

18. A semiconductor package structure, comprising:
an interposer;
a first die stack electrically connected to the interposer; and
a second die stack electrically connected to the interposer,
wherein each of the first die stack and the second die stack comprises double-sided semiconductor dies vertically stacked such that a back-side interconnect structure of one semiconductor die is directly bonded to a front-side interconnect structure of an adjacent semiconductor die via hybrid bonding structures including direct metal-to-metal bonds between electrical bonding structures and direct dielectric-to-dielectric bonds between dielectric layers, the hybrid bonding structures arranged in a periodic array across interfacing surfaces of the back-side interconnect structure and the front-side interconnect structure;

wherein each double-sided semiconductor die comprises a vertical stack including a front-side interconnect structure, a central portion, and a back-side interconnect structure; and wherein the central portion comprises:

a semiconductor substrate portion having a front surface and a back surface, field effect transistors located on the front surface of the semiconductor substrate portion as front-end-of-line electrical circuit elements with gate structures, source regions, and drain regions, the field effect transistors laterally spaced by shallow trench isolation structures embedded within the semiconductor substrate portion, a planarization dielectric layer overlying or underlying the first shallow trench isolation structures and laterally surrounding the first field effect transistors, and conductive vias located outside of, and laterally spaced from, the field effect transistors and vertically extending through the shallow trench isolation structures to electrically connect the front-side interconnect structure to the back-side interconnect structure while being laterally positioned between adjacent field effect transistors and contacting a respective front-side electrical interconnect in the front-side interconnect structure in a horizontal plane containing a planar surface of the planarization dielectric layer and contacting a respective back-side electrical interconnect in the back-side interconnect structure.

19. The semiconductor package structure of claim 18, wherein:

the hybrid bonding structures provide direct contact between the electrical bonding structures of the back-side interconnect structure of an underlying semiconductor die and the electrical bonding structures of the front-side interconnect structure of an overlying semiconductor die, and direct contact between the dielectric layers of the back-side interconnect structure of the underlying semiconductor die and the dielectric layers of the front-side interconnect structure of the overlying semiconductor die;

the interfacing surfaces are in continuous physical engagement without intervening bonding materials; and the conductive vias within the shallow trench isolation structures of the central portion maintaining electrical continuity across the vertical stack of the double-sided semiconductor die while being isolated from the gate structures, source regions, and drain regions of the field effect transistors on the front surface of the semiconductor substrate portion.

20. The semiconductor package structure of claim 19, wherein:

the direct metal-to-metal bonds and the direct dielectric-to-dielectric bonds form a seamless interface geometry between the underlying semiconductor die and the overlying semiconductor die;

the conductive vias are laterally embedded within the shallow trench isolation structures to isolate the field effect transistors formed on the front surface of the semiconductor substrate portion; and the central portion provides electrical connections through the semiconductor substrate portion from the front surface to the back surface without penetrating through active regions of the field effect transistors including the gate structures, source regions, and drain regions.

* * * * *